US011934054B2

(12) United States Patent
Dunn et al.

(10) Patent No.: US 11,934,054 B2
(45) Date of Patent: *Mar. 19, 2024

(54) FIELD SERVICEABLE AND REPLACEABLE ASSEMBLY

(71) Applicant: Manufacturing Resources International, Inc., Alpharetta, GA (US)

(72) Inventors: William Dunn, Alpharetta, GA (US); Kevin O'Connor, Duluth, GA (US); Marcos Diaz, Alpharetta, GA (US)

(73) Assignee: Manufacturing Resources International, Inc., Alpharetta, GA (US)

( * ) Notice: Subject to any disclaimer, the term of this patent is extended or adjusted under 35 U.S.C. 154(b) by 32 days.

This patent is subject to a terminal disclaimer.

(21) Appl. No.: 17/171,427

(22) Filed: Feb. 9, 2021

(65) Prior Publication Data
US 2021/0168949 A1    Jun. 3, 2021

Related U.S. Application Data

(63) Continuation of application No. 16/882,915, filed on May 26, 2020, now Pat. No. 10,925,174, which is a
(Continued)

(51) Int. Cl.
*H05K 5/00*    (2006.01)
*G02F 1/1333*    (2006.01)
(Continued)

(52) U.S. Cl.
CPC .... *G02F 1/133308* (2013.01); *G02F 1/13338* (2013.01); *G02F 1/133382* (2013.01);
(Continued)

(58) Field of Classification Search
CPC .......... G02F 1/133308; G02F 1/13338; G02F 1/133382; G02F 1/133385;
(Continued)

(56) References Cited

U.S. PATENT DOCUMENTS 2,029,221 A    1/1936  Burgess et al.
2,678,860 A    5/1954  Peterson
(Continued)

FOREIGN PATENT DOCUMENTS

AU    2011248190 B2    5/2011
AU    2014287438 B2    1/2018
(Continued)

OTHER PUBLICATIONS

Itsenclosures, Product Catalog, 2009, 48 pages.
(Continued)

*Primary Examiner* — Stephen S Sul
(74) *Attorney, Agent, or Firm* — Standley Law Group LLP; Jeffrey S. Standley; Adam J. Smith

(57) ABSTRACT

Interchangeable display assemblies are provided. A frame is configured to interchangeably accept any one of a number of digital side assemblies, each including an electronic display, a number of static side assemblies, each including a poster cavity which accepts signage, and a number of cover side assemblies at a first portion and any other one of the number of digital side assemblies, the number of static side assemblies, and the number of cover side assemblies at a second portion thereof.

18 Claims, 21 Drawing Sheets

Related U.S. Application Data continuation of application No. 16/379,448, filed on Apr. 9, 2019, now Pat. No. 10,716,224, which is a continuation of application No. 15/886,889, filed on Feb. 2, 2018, now Pat. No. 10,499,516.

(60) Provisional application No. 62/502,337, filed on May 5, 2017, provisional application No. 62/491,106, filed on Apr. 27, 2017.

(51) Int. Cl.
*G09F 9/30* (2006.01)
*G09F 9/35* (2006.01)
*G09F 13/04* (2006.01)
*G09F 21/04* (2006.01)
*H05K 5/02* (2006.01)
*H05K 5/03* (2006.01)
*H05K 7/14* (2006.01)
*H05K 7/20* (2006.01)

(52) U.S. Cl.
CPC .......... *G02F 1/133385* (2013.01); *G09F 9/30* (2013.01); *G09F 9/35* (2013.01); *G09F 13/0413* (2013.01); *G09F 13/0445* (2021.05); *G09F 21/04* (2013.01); *H05K 5/0017* (2013.01); *H05K 5/0226* (2013.01); *H05K 5/0247* (2013.01); *H05K 5/03* (2013.01); *H05K 7/1488* (2013.01); *H05K 7/20145* (2013.01); *H05K 7/20736* (2013.01); *H05K 7/20954* (2013.01); *H05K 7/20972* (2013.01); *G02F 1/133342* (2021.01); *G09F 13/044* (2021.05); *G09F 21/042* (2020.05)

(58) Field of Classification Search
CPC ......... G02F 1/133342; G02F 1/133331; G02F 2201/36; G09F 9/30; G09F 9/35; G09F 13/0413; G09F 21/04; G09F 13/044; G09F 13/0445; G09F 21/042; H05K 5/0017; H05K 5/0226; H05K 5/0247; H05K 5/03; H05K 7/1488; H05K 7/20145; H05K 7/20736; H05K 7/20954; H05K 7/20972
See application file for complete search history.

(56) References Cited

U.S. PATENT DOCUMENTS

| | | | |
|---|---|---|---|
| 3,510,973 A | 5/1970 | Mazzocco, Sr. | |
| 3,587,186 A | 6/1971 | Lane | |
| 3,984,931 A | 10/1976 | Belokin, Jr. | |
| 4,093,355 A | 6/1978 | Kaplit et al. | |
| 4,169,327 A | 10/1979 | Stilling | |
| 4,267,657 A | 5/1981 | Kloke | |
| 4,292,370 A | 9/1981 | Pekko | |
| 4,327,513 A | 5/1982 | de Gunzburg | |
| 4,452,000 A | 6/1984 | Gandy | |
| 4,547,987 A | 10/1985 | Stilling | |
| 4,593,978 A | 6/1986 | Mourey et al. | |
| 4,634,225 A | 1/1987 | Haim et al. | |
| 4,748,765 A | 6/1988 | Martin | |
| 4,759,143 A | 7/1988 | Pomerleau | |
| 4,763,993 A | 8/1988 | Vogeley et al. | |
| 4,817,317 A | 4/1989 | Kovalak, Jr. | |
| 4,903,423 A | 2/1990 | Hinca | |
| 4,905,390 A | 3/1990 | Stilling | |
| 4,921,041 A | 5/1990 | Akachi | |
| 4,952,783 A | 8/1990 | Aufderheide et al. | |
| 4,952,925 A | 8/1990 | Haastert | |
| 4,976,536 A | 12/1990 | Vogeley et al. | |
| 5,025,355 A | 6/1991 | Harwood | |
| 5,029,982 A | 7/1991 | Nash | |
| 5,088,806 A | 2/1992 | McCartney et al. | |
| 1,812,919 A | 7/1992 | Balder | |
| 5,132,666 A * | 7/1992 | Fahs | B60Q 1/503 340/472 |
| 5,179,367 A | 1/1993 | Shimizu | |
| 5,247,374 A | 9/1993 | Terada | |
| 5,255,029 A | 10/1993 | Vogeley et al. | |
| 5,282,114 A | 1/1994 | Stone | |
| 5,285,677 A | 2/1994 | Oehler | |
| 5,293,930 A | 3/1994 | Pitasi | |
| 5,299,109 A | 3/1994 | Grondal | |
| 5,351,176 A | 9/1994 | Smith et al. | |
| 5,423,142 A | 6/1995 | Douglas et al. | |
| 5,432,526 A | 7/1995 | Hyatt | |
| 5,457,905 A | 10/1995 | Kaplan | |
| 5,493,802 A | 2/1996 | Simson | |
| 5,535,816 A | 7/1996 | Ishida | |
| D373,120 S | 8/1996 | Andre et al. | |
| 5,559,614 A | 9/1996 | Urbish et al. | |
| 5,621,614 A | 4/1997 | O'Neill | |
| 5,657,641 A | 8/1997 | Cunningham et al. | |
| 5,717,424 A | 2/1998 | Simson et al. | |
| 5,748,269 A | 5/1998 | Harris et al. | |
| 5,755,050 A | 5/1998 | Aiken | |
| 5,765,743 A | 6/1998 | Sakiura et al. | |
| 5,767,489 A | 6/1998 | Ferrier | |
| 5,803,424 A | 9/1998 | Keehn et al. | |
| 5,808,418 A | 9/1998 | Pitman et al. | |
| 5,818,010 A | 10/1998 | McCann | |
| 5,818,694 A | 10/1998 | Daikoku et al. | |
| 5,835,179 A | 11/1998 | Yamanaka | |
| 5,864,465 A | 1/1999 | Liu | |
| 5,869,818 A | 2/1999 | Kim | |
| 5,869,919 A | 2/1999 | Sato et al. | |
| 5,899,027 A | 5/1999 | St. Louis | |
| 5,903,433 A | 5/1999 | Gudmundsson | |
| 5,920,367 A | 7/1999 | Kajimoto et al. | |
| D415,736 S | 10/1999 | Witte | |
| 5,991,153 A | 11/1999 | Heady et al. | |
| 6,003,015 A | 12/1999 | Kang et al. | |
| 6,007,205 A | 12/1999 | Fujimori | |
| 6,043,979 A | 3/2000 | Shim | |
| 6,050,833 A | 4/2000 | Danzyger et al. | |
| 6,089,751 A | 7/2000 | Conover et al. | |
| 6,104,451 A | 8/2000 | Matsuoka et al. | |
| 6,125,565 A * | 10/2000 | Hillstrom | G09F 13/0413 40/574 |
| 6,157,432 A | 12/2000 | Helbing | |
| 6,172,869 B1 | 1/2001 | Hood, III et al. | |
| 6,181,070 B1 | 1/2001 | Dunn et al. | |
| 6,191,839 B1 | 2/2001 | Briley et al. | |
| 6,198,222 B1 | 3/2001 | Chang | |
| 6,211,934 B1 | 4/2001 | Habing et al. | |
| 6,215,655 B1 | 4/2001 | Heady et al. | |
| 6,231,446 B1 | 5/2001 | Majima et al. | |
| 6,351,381 B1 | 2/2002 | Bilski et al. | |
| 6,359,390 B1 | 3/2002 | Nagai | |
| 6,392,727 B1 | 5/2002 | Larson et al. | |
| 6,405,463 B1 | 6/2002 | Roddy et al. | |
| 6,417,900 B1 | 7/2002 | Shin et al. | |
| 6,428,198 B1 | 8/2002 | Saccomanno et al. | |
| 6,437,673 B1 | 8/2002 | Nishida et al. | |
| 6,469,752 B1 | 10/2002 | Ishikawa et al. | |
| 6,473,150 B1 | 10/2002 | Takushima et al. | |
| 6,476,883 B1 | 11/2002 | Salimes et al. | |
| D467,561 S | 12/2002 | Kosciolek | |
| 6,493,440 B2 | 12/2002 | Gromatsky et al. | |
| 6,494,429 B2 | 12/2002 | Tajima | |
| 6,504,713 B1 | 1/2003 | Pandolfi et al. | |
| 6,535,266 B1 | 3/2003 | Nemeth et al. | |
| 6,557,284 B2 | 5/2003 | Nolan | |
| 6,628,355 B1 | 9/2003 | Takahara | |
| 6,643,130 B1 | 11/2003 | DeMarchis et al. | |
| 6,683,639 B2 | 1/2004 | Driessen-Olde Scheper et al. | |
| 6,701,143 B1 | 3/2004 | Dukach et al. | |
| 6,714,410 B2 | 3/2004 | Wellhofer | |
| 6,727,468 B1 | 4/2004 | Nemeth | |
| 6,742,583 B2 | 6/2004 | Tikka | |
| 6,748,685 B2 | 6/2004 | Peel | |

(56) References Cited

U.S. PATENT DOCUMENTS

| | | |
|---|---|---|
| 6,758,002 B1 | 7/2004 | Duguay |
| 6,812,851 B1 | 11/2004 | Dukach et al. |
| 6,825,828 B2 | 11/2004 | Burke et al. |
| 6,833,992 B2 | 12/2004 | Kusaka et al. |
| 6,839,104 B2 | 1/2005 | Taniguchi et al. |
| 6,850,209 B2 | 2/2005 | Mankins et al. |
| 6,885,412 B2 | 4/2005 | Ohnishi et al. |
| 6,886,942 B2 | 5/2005 | Okada et al. |
| 6,891,135 B2 | 5/2005 | Pala et al. |
| 6,909,486 B2 | 6/2005 | Wang et al. |
| 6,943,768 B2 | 9/2005 | Cavanaugh et al. |
| 6,949,772 B2 | 9/2005 | Shimizu et al. |
| 6,961,108 B2 | 11/2005 | Wang et al. |
| 6,962,528 B2 | 11/2005 | Yokota |
| 6,976,330 B2 | 12/2005 | Milliken |
| 7,015,470 B2 | 3/2006 | Faytlin et al. |
| 7,052,152 B2 | 5/2006 | Harbers et al. |
| 7,059,757 B2 | 6/2006 | Shimizu |
| 7,083,285 B2 | 8/2006 | Hsu et al. |
| D530,686 S | 10/2006 | Reza |
| 7,157,838 B2 | 1/2007 | Thielemans et al. |
| 7,161,803 B1 | 1/2007 | Heady |
| 7,190,416 B2 | 3/2007 | Paukshto et al. |
| 7,190,587 B2 | 3/2007 | Kim et al. |
| 7,209,349 B2 | 4/2007 | Chien et al. |
| 7,210,839 B2 | 5/2007 | Jung et al. |
| 7,212,403 B2 | 5/2007 | Rockenfell |
| D544,848 S | 6/2007 | Marz et al. |
| 7,226,176 B1 | 6/2007 | Huang |
| 7,259,964 B2 | 8/2007 | Yamamura et al. |
| 7,269,023 B2 | 9/2007 | Nagano |
| 7,284,874 B2 | 10/2007 | Jeong et al. |
| 7,292,435 B2 | 11/2007 | She |
| 7,324,080 B1 | 1/2008 | Hu et al. |
| 7,339,782 B1 | 3/2008 | Landes et al. |
| 7,396,145 B2 | 7/2008 | Wang et al. |
| 7,447,018 B2 | 11/2008 | Lee et al. |
| 7,452,121 B2 | 11/2008 | Cho et al. |
| 7,457,113 B2 | 11/2008 | Kumhyr et al. |
| 7,466,546 B2 | 12/2008 | Park |
| 7,480,140 B2 | 1/2009 | Hara et al. |
| 7,492,589 B2 | 2/2009 | Park |
| 7,513,830 B2 | 4/2009 | Hajder et al. |
| 7,518,864 B2 | 4/2009 | Kimura |
| 7,535,543 B2 | 5/2009 | Dewa et al. |
| D595,678 S | 7/2009 | Dunn |
| 7,589,958 B2 | 9/2009 | Smith |
| 7,591,508 B2 | 9/2009 | Chang |
| 7,601,067 B2 | 10/2009 | Anderson |
| 7,602,469 B2 | 10/2009 | Shin |
| 7,609,506 B2 | 10/2009 | Aguirre |
| D608,775 S | 1/2010 | Leung |
| 7,667,964 B2 | 2/2010 | Kang et al. |
| 7,682,047 B2 | 3/2010 | Hsu et al. |
| 7,752,858 B2 | 7/2010 | Johnson et al. |
| 7,753,567 B2 | 7/2010 | Kang et al. |
| 7,762,707 B2 | 7/2010 | Kim et al. |
| 7,768,775 B2 | 8/2010 | Kim |
| 7,800,706 B2 | 9/2010 | Kim et al. |
| 7,813,124 B2 | 10/2010 | Karppanen |
| 7,903,416 B2 | 3/2011 | Chou |
| D635,614 S | 4/2011 | Yan |
| 7,965,039 B2 | 6/2011 | Watanabe et al. |
| 7,985,139 B2 | 7/2011 | Lind et al. |
| 7,995,342 B2 | 8/2011 | Nakamichi et al. |
| 8,004,648 B2 | 8/2011 | Dunn |
| 8,006,435 B2 | 8/2011 | DeBlonk et al. |
| 8,016,452 B2 | 9/2011 | Dunn |
| 8,035,968 B2 | 10/2011 | Kwon et al. |
| 8,081,465 B2 | 12/2011 | Nishiura |
| 8,102,173 B2 | 1/2012 | Merrow |
| 8,116,081 B2 | 2/2012 | Crick, Jr. |
| 8,142,027 B2 | 3/2012 | Sakai |
| D657,421 S | 4/2012 | Yan |
| D657,422 S | 4/2012 | Yan |
| 8,208,115 B2 | 6/2012 | Dunn |
| 8,223,311 B2 | 7/2012 | Kim et al. |
| 8,241,573 B2 | 8/2012 | Banerjee et al. |
| 8,248,784 B2 | 8/2012 | Nakamichi et al. |
| 8,254,121 B2 | 8/2012 | Lee et al. |
| 8,269,916 B2 | 9/2012 | Ohkawa |
| 8,270,163 B2 | 9/2012 | Nakamichi et al. |
| 8,274,622 B2 | 9/2012 | Dunn |
| 8,274,789 B2 | 9/2012 | Nakamichi et al. |
| D669,938 S | 10/2012 | Lard et al. |
| 8,300,203 B2 | 10/2012 | Nakamichi et al. |
| 8,310,824 B2 | 11/2012 | Dunn et al. |
| 8,320,119 B2 | 11/2012 | Isoshima et al. |
| 8,351,014 B2 | 1/2013 | Dunn |
| 8,358,397 B2 | 1/2013 | Dunn |
| 8,369,083 B2 | 2/2013 | Dunn et al. |
| 8,373,841 B2 | 2/2013 | Dunn |
| 8,379,182 B2 | 2/2013 | Dunn |
| 8,400,608 B2 | 3/2013 | Takahashi et al. |
| 8,418,387 B2 | 4/2013 | Swatt et al. |
| 8,472,174 B2 | 6/2013 | Idems et al. |
| 8,472,191 B2 | 6/2013 | Yamamoto et al. |
| 8,482,695 B2 | 7/2013 | Dunn |
| 8,497,972 B2 | 7/2013 | Dunn et al. |
| 8,537,302 B2 | 9/2013 | Dunn |
| 8,590,602 B2 | 11/2013 | Fernandez |
| 8,649,170 B2 | 2/2014 | Dunn et al. |
| 8,649,176 B2 | 2/2014 | Okada et al. |
| 8,654,302 B2 | 2/2014 | Dunn et al. |
| 8,678,603 B2 | 3/2014 | Zhang |
| 8,693,185 B2 | 4/2014 | Dunn et al. |
| 8,700,226 B2 | 4/2014 | Schuch et al. |
| 8,711,321 B2 | 4/2014 | Dunn et al. |
| D704,265 S | 5/2014 | Yan |
| 8,749,749 B2 | 6/2014 | Hubbard |
| 8,755,021 B2 | 6/2014 | Hubbard |
| 8,758,144 B2 | 6/2014 | Williams et al. |
| 8,760,613 B2 | 6/2014 | Dunn |
| 8,767,165 B2 | 7/2014 | Dunn |
| 8,773,633 B2 | 7/2014 | Dunn et al. |
| 8,804,091 B2 | 8/2014 | Dunn et al. |
| 8,823,916 B2 | 9/2014 | Hubbard et al. |
| 8,827,472 B2 | 9/2014 | Takada |
| 8,854,572 B2 | 10/2014 | Dunn |
| 8,854,595 B2 | 10/2014 | Dunn |
| 8,879,042 B2 | 11/2014 | Dunn |
| 8,919,778 B2 | 12/2014 | Fodera |
| 8,976,313 B2 | 3/2015 | Kim et al. |
| 8,988,647 B2 | 3/2015 | Hubbard |
| 9,030,641 B2 | 5/2015 | Dunn |
| 9,089,079 B2 | 7/2015 | Dunn |
| 9,119,325 B2 | 8/2015 | Dunn et al. |
| 9,119,330 B2 | 8/2015 | Hubbard et al. |
| 9,173,322 B2 | 10/2015 | Dunn |
| 9,173,325 B2 | 10/2015 | Dunn |
| 9,235,232 B2 | 1/2016 | King |
| 9,282,676 B1 * | 3/2016 | Diaz ................... H05K 5/0017 |
| 9,285,108 B2 | 3/2016 | Dunn et al. |
| 9,313,447 B2 | 4/2016 | Dunn et al. |
| 9,313,917 B2 | 4/2016 | Dunn et al. |
| 9,317,060 B2 | 4/2016 | Dunn et al. |
| 9,338,923 B2 | 5/2016 | Lee et al. |
| 9,357,673 B2 | 5/2016 | Chin |
| 9,370,127 B2 | 6/2016 | Dunn |
| 9,414,516 B2 | 8/2016 | Chin et al. |
| 9,448,569 B2 | 9/2016 | Schuch et al. |
| 9,451,060 B1 | 9/2016 | Bowers et al. |
| 9,451,733 B2 | 9/2016 | Dunn et al. |
| 9,456,525 B2 | 9/2016 | Yoon et al. |
| 9,470,924 B2 | 10/2016 | Dunn et al. |
| 9,500,896 B2 | 11/2016 | Dunn et al. |
| 9,516,485 B1 | 12/2016 | Bowers et al. |
| 9,549,490 B2 | 1/2017 | Hubbard |
| 9,594,271 B2 | 3/2017 | Dunn et al. |
| 9,613,548 B2 | 4/2017 | DeMars |
| 9,622,392 B1 | 4/2017 | Bowers et al. |
| 9,629,287 B2 | 4/2017 | Dunn |
| 9,648,790 B2 | 5/2017 | Dunn et al. |
| 9,655,289 B2 | 5/2017 | Dunn et al. |

(56) References Cited

U.S. PATENT DOCUMENTS

| | | |
|---|---|---|
| 9,703,230 B2 | 7/2017 | Bowers et al. |
| 9,703,320 B2 | 7/2017 | Bowers et al. |
| 9,723,765 B2 | 8/2017 | DeMars |
| 9,743,553 B2 | 8/2017 | Kim et al. |
| 9,756,739 B2 | 9/2017 | Russell-Clarke et al. |
| 9,797,588 B2 | 10/2017 | Dunn et al. |
| 9,801,305 B2 | 10/2017 | Dunn et al. |
| 9,823,690 B2 | 11/2017 | Bowers et al. |
| 9,835,893 B2 | 12/2017 | Dunn |
| 9,861,007 B2 | 1/2018 | Yoon et al. |
| 9,894,800 B2 | 2/2018 | Dunn |
| 10,080,316 B2 | 9/2018 | Dunn et al. |
| 10,088,702 B2 | 10/2018 | Dunn et al. |
| 10,143,106 B2 | 11/2018 | Diaz |
| 10,180,591 B2 | 1/2019 | Lee et al. |
| 10,194,564 B2 | 1/2019 | Dunn et al. |
| 10,212,845 B2 | 2/2019 | Dunn et al. |
| 10,278,311 B2 | 4/2019 | DeMars |
| 10,306,781 B2 | 5/2019 | Cho et al. |
| 10,314,212 B2 | 6/2019 | Hubbard |
| 10,359,659 B2 | 7/2019 | Dunn et al. |
| 10,359,817 B2 | 7/2019 | Yun et al. |
| 10,383,238 B2 | 8/2019 | Yun et al. |
| 10,398,058 B2 | 8/2019 | Diaz |
| 10,398,066 B2 | 8/2019 | Dunn et al. |
| 10,401,016 B2 | 9/2019 | Coo |
| 10,420,257 B2 | 9/2019 | Dunn et al. |
| 10,485,113 B2 | 11/2019 | Dunn et al. |
| 10,485,147 B2 | 11/2019 | Oh et al. |
| 10,485,148 B2 | 11/2019 | Oh et al. |
| 10,499,516 B2 * | 12/2019 | Dunn .................. H05K 5/03 |
| 10,506,738 B2 | 12/2019 | Dunn |
| 10,506,740 B2 | 12/2019 | Dunn et al. |
| 10,524,384 B2 | 12/2019 | Dunn et al. |
| 10,524,397 B2 | 12/2019 | Dunn et al. |
| 10,548,247 B2 | 1/2020 | Demars |
| 10,602,626 B2 | 3/2020 | Dunn |
| 10,624,218 B2 | 4/2020 | Dunn et al. |
| 10,660,245 B2 | 5/2020 | Dunn et al. |
| 10,687,446 B2 | 6/2020 | Dunn et al. |
| 10,716,224 B2 * | 7/2020 | Dunn ................ H05K 5/0017 |
| 10,721,836 B2 | 7/2020 | Dunn et al. |
| 10,736,245 B2 | 8/2020 | Dunn et al. |
| 10,757,844 B2 | 8/2020 | Dunn et al. |
| 10,795,413 B1 | 10/2020 | Dunn |
| 10,820,445 B2 | 10/2020 | Diaz |
| 10,827,644 B2 | 11/2020 | Diaz |
| 10,827,656 B2 | 11/2020 | Hubbard |
| 10,925,174 B2 * | 2/2021 | Dunn ................. G02F 1/13338 |
| 2001/0001459 A1 | 5/2001 | Savant et al. |
| 2001/0019454 A1 | 9/2001 | Tadic-Galeb et al. |
| 2001/0023914 A1 | 9/2001 | Oddsen, Jr. |
| 2001/0032404 A1 | 10/2001 | Hillstrom |
| 2001/0043290 A1 | 11/2001 | Yamamoto |
| 2001/0043293 A1 | 11/2001 | Inoue |
| 2002/0009978 A1 | 1/2002 | Dukach et al. |
| 2002/0033919 A1 | 3/2002 | Sanelle et al. |
| 2002/0050793 A1 | 5/2002 | Cull et al. |
| 2002/0065046 A1 | 5/2002 | Mankins et al. |
| 2002/0084891 A1 | 7/2002 | Mankins et al. |
| 2002/0101553 A1 | 8/2002 | Enomoto et al. |
| 2002/0112026 A1 | 8/2002 | Fridman et al. |
| 2002/0126248 A1 | 9/2002 | Yoshia |
| 2002/0148600 A1 | 10/2002 | Bosch et al. |
| 2002/0149714 A1 | 10/2002 | Anderson et al. |
| 2002/0154255 A1 | 10/2002 | Gromatzky et al. |
| 2002/0164944 A1 | 11/2002 | Haglid |
| 2002/0164962 A1 | 11/2002 | Mankins et al. |
| 2002/0167637 A1 | 11/2002 | Burke et al. |
| 2003/0007109 A1 | 1/2003 | Park |
| 2003/0020884 A1 | 1/2003 | Okada et al. |
| 2003/0039094 A1 | 2/2003 | Sarkinen et al. |
| 2003/0043091 A1 | 3/2003 | Takeuchi et al. |
| 2003/0104210 A1 | 6/2003 | Azumi et al. |
| 2003/0128511 A1 | 7/2003 | Nagashima et al. |
| 2003/0214785 A1 | 11/2003 | Perazzo |
| 2004/0012722 A1 | 1/2004 | Alvarez |
| 2004/0025389 A1 | 2/2004 | Peterson |
| 2004/0035032 A1 | 2/2004 | Milliken |
| 2004/0035558 A1 | 2/2004 | Todd et al. |
| 2004/0036622 A1 | 2/2004 | Dukach et al. |
| 2004/0036834 A1 | 2/2004 | Ohnishi et al. |
| 2004/0042174 A1 | 3/2004 | Tomioka et al. |
| 2004/0103570 A1 | 6/2004 | Ruttenberg |
| 2004/0105159 A1 | 6/2004 | Saccomanno et al. |
| 2004/0135482 A1 | 7/2004 | Thielemans et al. |
| 2004/0165139 A1 | 8/2004 | Anderson et al. |
| 2004/0212548 A1 | 10/2004 | Ruttenberg |
| 2004/0223299 A1 | 11/2004 | Ghosh |
| 2004/0257492 A1 | 12/2004 | Mai et al. |
| 2005/0012039 A1 | 1/2005 | Faytlin et al. |
| 2005/0012722 A1 | 1/2005 | Chon |
| 2005/0062373 A1 | 3/2005 | Kim et al. |
| 2005/0073632 A1 | 4/2005 | Dunn et al. |
| 2005/0073639 A1 | 4/2005 | Pan |
| 2005/0105178 A1 | 5/2005 | Kim |
| 2005/0127796 A1 | 6/2005 | Olesen et al. |
| 2005/0134525 A1 | 6/2005 | Tanghe et al. |
| 2005/0134526 A1 | 6/2005 | Willem et al. |
| 2005/0213950 A1 | 9/2005 | Yoshimura |
| 2005/0219841 A1 | 10/2005 | Ikeda et al. |
| 2005/0229630 A1 | 10/2005 | Richter et al. |
| 2005/0237714 A1 | 10/2005 | Ebermann |
| 2005/0253699 A1 | 11/2005 | Madonia |
| 2005/0276053 A1 | 12/2005 | Nortrup et al. |
| 2005/0286131 A1 | 12/2005 | Saxena et al. |
| 2006/0012958 A1 | 1/2006 | Tomioka et al. |
| 2006/0012985 A1 | 1/2006 | Archie, Jr. et al. |
| 2006/0018093 A1 | 1/2006 | Ai et al. |
| 2006/0034051 A1 | 2/2006 | Wang et al. |
| 2006/0056994 A1 | 3/2006 | Van Lear et al. |
| 2006/0077636 A1 | 4/2006 | Kim |
| 2006/0082271 A1 | 4/2006 | Lee et al. |
| 2006/0092348 A1 | 5/2006 | Park |
| 2006/0125998 A1 | 6/2006 | Dewa et al. |
| 2006/0132699 A1 | 6/2006 | Cho et al. |
| 2006/0137294 A1 | 6/2006 | Waits et al. |
| 2006/0177587 A1 | 8/2006 | Shizuka et al. |
| 2006/0199514 A1 | 9/2006 | Kimura |
| 2006/0209266 A1 | 9/2006 | Utsunomiya |
| 2006/0215421 A1 | 9/2006 | Chang et al. |
| 2006/0218828 A1 | 10/2006 | Schrimpf et al. |
| 2006/0260790 A1 | 11/2006 | Theno et al. |
| 2006/0262079 A1 | 11/2006 | Seong et al. |
| 2006/0266499 A1 | 11/2006 | Choi et al. |
| 2006/0269216 A1 | 11/2006 | Wiemeyer et al. |
| 2006/0283579 A1 | 12/2006 | Ghosh et al. |
| 2007/0013647 A1 | 1/2007 | Lee et al. |
| 2007/0019419 A1 | 1/2007 | Hafuka et al. |
| 2007/0021217 A1 | 1/2007 | Wu |
| 2007/0030879 A1 | 2/2007 | Hatta |
| 2007/0046874 A1 | 3/2007 | Adachi et al. |
| 2007/0047239 A1 | 3/2007 | Kang et al. |
| 2007/0065091 A1 | 3/2007 | Hinata et al. |
| 2007/0070615 A1 | 3/2007 | Joslin et al. |
| 2007/0076431 A1 | 4/2007 | Atarashi et al. |
| 2007/0081344 A1 | 4/2007 | Cappaert et al. |
| 2007/0103863 A1 | 5/2007 | Kim |
| 2007/0103866 A1 | 5/2007 | Park |
| 2007/0115686 A1 | 5/2007 | Tyberghien |
| 2007/0139574 A1 | 6/2007 | Ko et al. |
| 2007/0139929 A1 | 6/2007 | Yoo et al. |
| 2007/0140671 A1 | 6/2007 | Yoshimura |
| 2007/0144704 A1 | 6/2007 | Bundza et al. |
| 2007/0151274 A1 | 7/2007 | Roche et al. |
| 2007/0151664 A1 | 7/2007 | Shin |
| 2007/0171353 A1 | 7/2007 | Hong |
| 2007/0206158 A1 | 9/2007 | Kinoshita et al. |
| 2007/0211205 A1 | 9/2007 | Shibata |
| 2007/0212211 A1 | 9/2007 | Chiyoda et al. |
| 2007/0217221 A1 | 9/2007 | Lee et al. |
| 2007/0237636 A1 | 10/2007 | Hsu |
| 2007/0253205 A1 | 11/2007 | Welker |
| 2007/0267174 A1 | 11/2007 | Kim |

(56) References Cited

U.S. PATENT DOCUMENTS

| | | |
|---|---|---|
| 2008/0002350 A1 | 1/2008 | Farrugia |
| 2008/0035315 A1 | 2/2008 | Han |
| 2008/0054144 A1 | 3/2008 | Wohlford |
| 2008/0055534 A1 | 3/2008 | Kawano |
| 2008/0076342 A1 | 3/2008 | Bryant et al. |
| 2008/0099193 A1 | 5/2008 | Aksamit et al. |
| 2008/0100186 A1 | 5/2008 | Li |
| 2008/0148609 A1 | 6/2008 | Ogoreve |
| 2008/0174456 A1 | 7/2008 | Warren |
| 2008/0209934 A1 | 9/2008 | Richards |
| 2008/0218446 A1 | 9/2008 | Yamanaka |
| 2008/0236005 A1 | 10/2008 | Isayev et al. |
| 2008/0255901 A1 | 10/2008 | Carroll et al. |
| 2008/0267790 A1 | 10/2008 | Gaudet et al. |
| 2008/0276507 A1 | 11/2008 | Hines |
| 2008/0283234 A1 | 11/2008 | Sagi et al. |
| 2008/0285290 A1 | 11/2008 | Ohashi et al. |
| 2008/0296134 A1 | 12/2008 | Hattori et al. |
| 2008/0304219 A1 | 12/2008 | Chen |
| 2008/0310116 A1 | 12/2008 | O'Connor |
| 2008/0310158 A1 | 12/2008 | Harbers et al. |
| 2009/0009041 A1 | 1/2009 | Zeidler |
| 2009/0009047 A1 | 1/2009 | Yanagawa et al. |
| 2009/0009729 A1 | 1/2009 | Sakai |
| 2009/0016004 A1 | 1/2009 | McCoy |
| 2009/0059518 A1 | 3/2009 | Kakikawa et al. |
| 2009/0065007 A1 | 3/2009 | Wilkinson et al. |
| 2009/0086430 A1 | 4/2009 | Kang et al. |
| 2009/0095819 A1 | 4/2009 | Brown et al. |
| 2009/0104989 A1 | 4/2009 | Williams et al. |
| 2009/0120629 A1 | 5/2009 | Ashe |
| 2009/0122218 A1 | 5/2009 | Oh et al. |
| 2009/0126906 A1 | 5/2009 | Dunn |
| 2009/0126907 A1 | 5/2009 | Dunn |
| 2009/0126914 A1 | 5/2009 | Dunn |
| 2009/0129021 A1 | 5/2009 | Dunn |
| 2009/0135365 A1 | 5/2009 | Dunn |
| 2009/0141199 A1 | 6/2009 | Fujikawa |
| 2009/0147170 A1 | 6/2009 | Oh et al. |
| 2009/0154096 A1 | 6/2009 | Iyengar et al. |
| 2009/0174626 A1 | 7/2009 | Isoshima et al. |
| 2009/0231807 A1 | 9/2009 | Bouissiere |
| 2009/0241388 A1 | 10/2009 | Dunn |
| 2009/0241437 A1 | 10/2009 | Steinle et al. |
| 2009/0244472 A1 | 10/2009 | Dunn |
| 2009/0266507 A1 | 10/2009 | Turnbull et al. |
| 2009/0278007 A1 | 11/2009 | Taylor |
| 2009/0279240 A1 | 11/2009 | Karppanen |
| 2009/0302727 A1 | 12/2009 | Vincent et al. |
| 2009/0306820 A1 | 12/2009 | Simmons et al. |
| 2009/0323275 A1 | 12/2009 | Rehmann et al. |
| 2010/0060861 A1 | 3/2010 | Medin |
| 2010/0079949 A1 | 4/2010 | Nakamichi et al. |
| 2010/0079979 A1* | 4/2010 | Nakamichi ....... G02F 1/133385 362/97.1 |
| 2010/0162747 A1 | 7/2010 | Hamel et al. |
| 2010/0171889 A1 | 7/2010 | Pantel et al. |
| 2010/0182562 A1 | 7/2010 | Yoshida et al. |
| 2010/0220249 A1 | 9/2010 | Nakamichi et al. |
| 2010/0226091 A1 | 9/2010 | Punn |
| 2010/0232107 A1 | 9/2010 | Dunn |
| 2010/0238394 A1 | 9/2010 | Dunn |
| 2010/0321887 A1 | 12/2010 | Kwon et al. |
| 2011/0001898 A1 | 1/2011 | Mikubo et al. |
| 2011/0013114 A1 | 1/2011 | Dunn et al. |
| 2011/0019348 A1 | 1/2011 | Kludt et al. |
| 2011/0019363 A1 | 1/2011 | Vahlsing et al. |
| 2011/0032489 A1 | 2/2011 | Kimoto et al. |
| 2011/0051071 A1 | 3/2011 | Nakamichi et al. |
| 2011/0058326 A1* | 3/2011 | Idems ................ G09F 9/30 361/679.21 |
| 2011/0072697 A1 | 3/2011 | Miller |
| 2011/0075361 A1 | 3/2011 | Nakamichi et al. |
| 2011/0083460 A1 | 4/2011 | Thomas et al. |
| 2011/0083824 A1 | 4/2011 | Rogers |
| 2011/0085301 A1 | 4/2011 | Dunn |
| 2011/0085302 A1 | 4/2011 | Nakamichi et al. |
| 2011/0090630 A1 | 4/2011 | Bergeron et al. |
| 2011/0114384 A1 | 5/2011 | Sakamoto et al. |
| 2011/0116000 A1 | 5/2011 | Dunn et al. |
| 2011/0116231 A1 | 5/2011 | Dunn et al. |
| 2011/0122162 A1 | 5/2011 | Sato et al. |
| 2011/0134356 A1 | 6/2011 | Swatt et al. |
| 2011/0141672 A1 | 6/2011 | Farley, Jr. et al. |
| 2011/0141724 A1 | 6/2011 | Erion |
| 2011/0162831 A1 | 7/2011 | Lee et al. |
| 2011/0167845 A1 | 7/2011 | Lee et al. |
| 2011/0227467 A1 | 9/2011 | Foppe, Jr. et al. |
| 2011/0261523 A1 | 10/2011 | Dunn et al. |
| 2011/0297810 A1 | 12/2011 | Tachibana |
| 2012/0006523 A1 | 1/2012 | Masahiro et al. |
| 2012/0012295 A1 | 1/2012 | Kakiuchi et al. |
| 2012/0012300 A1 | 1/2012 | Dunn et al. |
| 2012/0014063 A1 | 1/2012 | Weiss |
| 2012/0020114 A1 | 1/2012 | Miyamoto et al. |
| 2012/0038849 A1 | 2/2012 | Dunn et al. |
| 2012/0044217 A1 | 2/2012 | Okada et al. |
| 2012/0050958 A1 | 3/2012 | Sanford et al. |
| 2012/0105424 A1 | 5/2012 | Lee et al. |
| 2012/0105790 A1 | 5/2012 | Hubbard |
| 2012/0106081 A1 | 5/2012 | Hubbard et al. |
| 2012/0131936 A1 | 5/2012 | Yoshida et al. |
| 2012/0188481 A1 | 7/2012 | Kang et al. |
| 2012/0206687 A1 | 8/2012 | Dunn et al. |
| 2012/0224116 A1* | 9/2012 | Barnes ................ G09F 13/04 362/370 |
| 2012/0236499 A1 | 9/2012 | Murayama et al. |
| 2012/0249402 A1 | 10/2012 | Kang |
| 2012/0253672 A1 | 10/2012 | Hoshino et al. |
| 2012/0255704 A1 | 10/2012 | Nakamichi |
| 2012/0274876 A1 | 11/2012 | Cappaert et al. |
| 2012/0284547 A1 | 11/2012 | Culbert et al. |
| 2012/0327600 A1 | 12/2012 | Dunn |
| 2013/0170140 A1 | 7/2013 | Dunn |
| 2013/0173358 A1 | 7/2013 | Pinkus |
| 2013/0176517 A1 | 7/2013 | Kim et al. |
| 2013/0201685 A1 | 8/2013 | Messmore et al. |
| 2013/0211583 A1 | 8/2013 | Borra |
| 2013/0258659 A1 | 10/2013 | Erion |
| 2013/0270975 A1 | 10/2013 | Dunn et al. |
| 2013/0279154 A1 | 10/2013 | Dunn |
| 2013/0294039 A1 | 11/2013 | Chao |
| 2013/0344794 A1 | 12/2013 | Shaw et al. |
| 2014/0044147 A1 | 2/2014 | Wyatt et al. |
| 2014/0055914 A1 | 2/2014 | Fournier |
| 2014/0078407 A1* | 3/2014 | Green ................ A47F 3/043 348/836 |
| 2014/0085564 A1 | 3/2014 | Hendren et al. |
| 2014/0111758 A1 | 4/2014 | Dunn et al. |
| 2014/0113540 A1 | 4/2014 | Dunn et al. |
| 2014/0134767 A1 | 5/2014 | Ishida et al. |
| 2014/0184980 A1 | 7/2014 | Onoue |
| 2014/0190240 A1 | 7/2014 | He et al. |
| 2014/0208626 A1 | 7/2014 | Moon |
| 2014/0268657 A1 | 9/2014 | Dunn et al. |
| 2014/0313666 A1 | 10/2014 | Chin |
| 2014/0313698 A1 | 10/2014 | Dunn et al. |
| 2014/0314395 A1 | 10/2014 | Dunn et al. |
| 2014/0334100 A1* | 11/2014 | Yoon ................ G06F 1/20 361/748 |
| 2014/0361138 A1* | 12/2014 | Ramirez ............ G09B 19/00 248/469 |
| 2015/0009625 A1 | 1/2015 | Chin et al. |
| 2015/0009627 A1* | 1/2015 | Dunn ................ G02F 1/133382 361/695 |
| 2015/0192371 A1 | 7/2015 | Hancock |
| 2015/0211676 A1 | 7/2015 | Martin et al. |
| 2015/0237761 A1* | 8/2015 | Dunn ................ H05K 7/20972 362/97.3 |
| 2015/0253611 A1 | 9/2015 | Yang et al. |
| 2015/0264826 A1 | 9/2015 | Dunn et al. |
| 2015/0319882 A1* | 11/2015 | Dunn ................ F21V 29/677 361/695 |
| 2015/0366101 A1 | 12/2015 | Dunn et al. |

(56) References Cited

U.S. PATENT DOCUMENTS

| | | |
|---|---|---|
| 2016/0041423 A1 | 2/2016 | Dunn |
| 2016/0044829 A1 | 2/2016 | Dunn |
| 2016/0162297 A1 | 6/2016 | Shao |
| 2016/0192536 A1 | 6/2016 | Diaz |
| 2016/0195254 A1 | 7/2016 | Dunn et al. |
| 2016/0198588 A1 | 7/2016 | DeMars |
| 2016/0238876 A1 | 8/2016 | Dunn et al. |
| 2016/0242329 A1* | 8/2016 | DeMars ............. H05K 7/20972 |
| 2016/0242330 A1 | 8/2016 | Dunn |
| 2016/0249493 A1 | 8/2016 | Dunn et al. |
| 2016/0265759 A1 | 9/2016 | Na et al. |
| 2016/0302331 A1 | 10/2016 | Dunn |
| 2017/0023823 A1 | 1/2017 | Dunn et al. |
| 2017/0068042 A1 | 3/2017 | Dunn et al. |
| 2017/0074453 A1* | 3/2017 | Bowers ...................... E04H 1/14 |
| 2017/0083043 A1* | 3/2017 | Bowers ...................... G06F 1/20 |
| 2017/0083062 A1 | 3/2017 | Bowers et al. |
| 2017/0111486 A1 | 4/2017 | Bowers et al. |
| 2017/0111520 A1 | 4/2017 | Bowers et al. |
| 2017/0111521 A1 | 4/2017 | Bowers et al. |
| 2017/0127579 A1 | 5/2017 | Hubbard |
| 2017/0140344 A1 | 5/2017 | Bowers et al. |
| 2017/0147992 A1 | 5/2017 | Bowers et al. |
| 2017/0163519 A1 | 6/2017 | Bowers et al. |
| 2017/0175411 A1 | 6/2017 | Bowers et al. |
| 2017/0188490 A1 | 6/2017 | Dunn et al. |
| 2017/0231112 A1 | 8/2017 | Dunn et al. |
| 2017/0245400 A1 | 8/2017 | Dunn et al. |
| 2017/0257978 A1 | 9/2017 | Diaz |
| 2017/0332523 A1 | 11/2017 | DeMars |
| 2017/0345346 A1 | 11/2017 | Hong et al. |
| 2018/0042134 A1 | 2/2018 | Dunn et al. |
| 2018/0088368 A1 | 3/2018 | Notoshi et al. |
| 2018/0116073 A1 | 4/2018 | Dunn |
| 2018/0314103 A1 | 11/2018 | Dunn et al. |
| 2018/0315356 A1 | 11/2018 | Dunn et al. |
| 2018/0317330 A1 | 11/2018 | Dunn et al. |
| 2018/0317350 A1 | 11/2018 | Dunn et al. |
| 2018/0364519 A1 | 12/2018 | Dunn et al. |
| 2019/0037738 A1 | 1/2019 | Dunn et al. |
| 2019/0059175 A1 | 2/2019 | Diaz |
| 2019/0089176 A1 | 3/2019 | Dunn et al. |
| 2019/0133002 A1 | 5/2019 | Dunn et al. |
| 2019/0208674 A1 | 7/2019 | Demars |
| 2019/0239365 A1 | 8/2019 | Dunn et al. |
| 2019/0289754 A1 | 9/2019 | Hubbard |
| 2019/0327865 A1 | 10/2019 | Dunn et al. |
| 2019/0335613 A1 | 10/2019 | Diaz |
| 2020/0037456 A1 | 1/2020 | Dunn |
| 2020/0154597 A1 | 5/2020 | Dunn et al. |
| 2020/0163234 A1 | 5/2020 | Dunn |
| 2020/0163235 A1 | 5/2020 | Dunn |
| 2020/0205303 A1 | 6/2020 | Dunn et al. |
| 2020/0253095 A1 | 8/2020 | Dunn et al. |
| 2020/0275585 A1 | 8/2020 | Dunn |
| 2020/0288585 A1 | 9/2020 | Dunn et al. |
| 2020/0319676 A1 | 10/2020 | Dunn |
| 2020/0352049 A1 | 11/2020 | Dunn et al. |
| 2020/0367391 A1 | 11/2020 | Dunn |
| 2020/0387194 A1 | 12/2020 | Dunn |
| 2021/0007241 A1 | 1/2021 | Diaz |
| 2021/0022273 A1 | 1/2021 | Hubbard |

FOREIGN PATENT DOCUMENTS

| | | |
|---|---|---|
| AU | 2015253128 B2 | 3/2018 |
| AU | 2017216500 B2 | 10/2018 |
| AU | 2017216500 B2 | 1/2019 |
| AU | 2015229457 B2 | 3/2019 |
| AU | 2016220308 B2 | 3/2019 |
| AU | 2017228430 B2 | 3/2020 |
| BR | PI0820231-1 | 2/2019 |
| CA | 2705814 C | 2/2018 |
| CA | 2947524 C | 4/2018 |
| CA | 2915261 C | 8/2018 |
| CA | 2780884 C | 4/2019 |
| CA | 27982777 C | 6/2019 |
| CA | 2809019 C | 9/2019 |
| CA | 2888494 C | 9/2019 |
| CA | 2976116 C | 11/2020 |
| CN | 2702363 Y | 5/2005 |
| CN | 202838830 U | 3/2013 |
| CN | 106304788 A | 1/2017 |
| CN | 107251671 A | 10/2017 |
| CN | 108700739 A | 10/2018 |
| CN | 107251671 B | 8/2019 |
| EP | 1408476 A1 | 4/2004 |
| EP | 1647766 A2 | 4/2006 |
| EP | 1762892 A1 | 3/2007 |
| EP | 1951020 A1 | 7/2008 |
| EP | 2225603 A2 | 9/2010 |
| EP | 2370987 A2 | 10/2011 |
| EP | 2603831 A2 | 6/2013 |
| EP | 2801888 A2 | 11/2014 |
| EP | 2909829 A1 | 8/2015 |
| EP | 3020260 A2 | 5/2016 |
| EP | 3040766 A1 | 7/2016 |
| EP | 3117693 A2 | 1/2017 |
| EP | 3259968 A1 | 12/2017 |
| EP | 3423886 A0 | 1/2019 |
| EP | 3468321 A1 | 4/2019 |
| EP | 3138372 B1 | 5/2019 |
| EP | 3117693 B1 | 8/2019 |
| EP | 2567283 B1 | 10/2019 |
| EP | 2909829 B1 | 2/2020 |
| EP | 3615978 A1 | 3/2020 |
| EP | 3616481 A1 | 3/2020 |
| EP | 3624574 A1 | 3/2020 |
| GB | 153110 | 11/1920 |
| GB | 2402205 A | 12/2004 |
| JP | 402062015 A | 3/1990 |
| JP | 402307080 A | 12/1990 |
| JP | 3153212 A | 7/1991 |
| JP | H06-2337 U | 1/1994 |
| JP | 6082745 A | 3/1994 |
| JP | H8-55567 A | 2/1996 |
| JP | 8115788 A | 5/1996 |
| JP | 8194437 A | 7/1996 |
| JP | H08-305301 A | 11/1996 |
| JP | 8339034 A | 12/1996 |
| JP | H9-160512 A | 6/1997 |
| JP | H09246766 A | 9/1997 |
| JP | 11160727 A | 6/1999 |
| JP | H11296094 A | 10/1999 |
| JP | 2000-10501 A | 1/2000 |
| JP | 2001209126 A | 8/2001 |
| JP | 2002-6282 A | 1/2002 |
| JP | 2002158475 A | 5/2002 |
| JP | 2003-76286 A | 3/2003 |
| JP | 2004053749 A | 2/2004 |
| JP | 2004-199675 A | 7/2004 |
| JP | 2004286940 A | 10/2004 |
| JP | 2005017556 A | 1/2005 |
| JP | 2000131682 A | 5/2005 |
| JP | 2005134849 A | 5/2005 |
| JP | 2005265922 A | 9/2005 |
| JP | 2005292939 A | 10/2005 |
| JP | 2005332253 A | 12/2005 |
| JP | 2006-32890 A | 2/2006 |
| JP | 2006513577 A | 4/2006 |
| JP | 2007322718 A | 5/2006 |
| JP | 2006148047 A | 6/2006 |
| JP | 2006163217 A | 6/2006 |
| JP | 2006-176112 A | 7/2006 |
| JP | 2006198344 | 8/2006 |
| JP | 2007003638 A | 1/2007 |
| JP | 2007-293105 A | 11/2007 |
| JP | 09307257 | 11/2007 |
| JP | 2008010361 A | 1/2008 |
| JP | 2008292743 A | 12/2008 |
| JP | 2010024624 A | 2/2010 |
| JP | 2010-102227 A | 5/2010 |
| JP | 2010-282109 A | 12/2010 |
| JP | 2011-14593 A | 1/2011 |

(56) References Cited

FOREIGN PATENT DOCUMENTS

| | | |
|---|---|---|
| JP | 2011-503663 A | 1/2011 |
| JP | 2011-75819 A | 4/2011 |
| JP | 2012-133254 A | 7/2012 |
| JP | 2013-537721 A | 10/2013 |
| JP | 2014-225595 A | 12/2014 |
| JP | 2017518526 A | 7/2017 |
| JP | 2018-511838 A | 4/2018 |
| JP | 6305564 B2 | 4/2018 |
| JP | 2019-512721 A | 5/2019 |
| JP | 6526245 B2 | 5/2019 |
| JP | 6688402 B2 | 4/2020 |
| JP | 6824440 B2 | 1/2021 |
| KR | 20000000118 U | 1/2000 |
| KR | 200163508 Y1 | 7/2000 |
| KR | 20000047899 A | 7/2000 |
| KR | 200206768 Y1 | 12/2000 |
| KR | 200236278 Y1 | 10/2001 |
| KR | 10-2067751 B1 | 1/2002 |
| KR | 2002-0057425 A | 7/2002 |
| KR | 200286961 Y1 | 8/2002 |
| KR | 1020040067701 A | 7/2004 |
| KR | 200366674 Y1 | 11/2004 |
| KR | 20050033986 A | 4/2005 |
| KR | 200401354 Y1 | 11/2005 |
| KR | 20060016469 A | 2/2006 |
| KR | 10-0563049 B1 | 3/2006 |
| KR | 10-2006-0070176 A | 6/2006 |
| KR | 100666961 B1 | 1/2007 |
| KR | 1020070070675 A | 4/2007 |
| KR | 1020070048294 | 8/2007 |
| KR | 10-2013-0126034 A | 11/2013 |
| KR | 101764381 B1 | 7/2017 |
| KR | 10-1847151 B1 | 4/2018 |
| KR | 10-1853885 B1 | 4/2018 |
| KR | 10-1868077 B1 | 6/2018 |
| KR | 10-1885884 B1 | 7/2018 |
| KR | 10-1894027 B1 | 8/2018 |
| KR | 10-1904363 B1 | 9/2018 |
| KR | 10-1958375 B1 | 3/2019 |
| KR | 10-2010515 B1 | 8/2019 |
| KR | 10-2063885 | 1/2020 |
| KR | 10-2104342 B1 | 4/2020 |
| KR | 10-2109072 B1 | 5/2020 |
| KR | 10-2165778 B1 | 10/2020 |
| RU | 2513043 C2 | 4/2014 |
| WO | WO2005079129 A1 | 8/2005 |
| WO | WO2007116116 A1 | 10/2007 |
| WO | WO2008050660 A2 | 5/2008 |
| WO | WO2009065125 A2 | 5/2009 |
| WO | WO2009065125 A3 | 5/2009 |
| WO | WO2009135308 A1 | 11/2009 |
| WO | WO2010007821 A1 | 2/2010 |
| WO | WO2010080624 A2 | 7/2010 |
| WO | WO2011059793 A2 | 5/2011 |
| WO | WO2011069084 A3 | 6/2011 |
| WO | WO2011072217 A3 | 6/2011 |
| WO | WO2011140179 A1 | 11/2011 |
| WO | WO2011150078 A2 | 12/2011 |
| WO | WO2012006620 A2 | 1/2012 |
| WO | WO2012021573 A2 | 2/2012 |
| WO | WO2012024426 A3 | 2/2012 |
| WO | WO2013/182733 A1 | 12/2013 |
| WO | WO2014062815 A1 | 4/2014 |
| WO | WO2014149773 A1 | 9/2014 |
| WO | WO2014150036 A1 | 9/2014 |
| WO | 2015138609 A2 | 9/2015 |
| WO | WO2015/138609 A2 | 9/2015 |
| WO | WO2015168375 A1 | 11/2015 |
| WO | 2016102980 A1 | 6/2016 |
| WO | WO2016/102980 A1 | 6/2016 |
| WO | WO2016102982 A1 | 6/2016 |
| WO | WO2016127613 A1 | 8/2016 |
| WO | WO2016133852 A1 | 8/2016 |
| WO | WO2017152166 A1 | 9/2017 |
| WO | WO2018/200260 A1 | 11/2018 |
| WO | WO2018/200905 A1 | 11/2018 |
| WO | 2020028045 A1 | 2/2020 |
| WO | WO2020/081687 A1 | 4/2020 |
| WO | WO2020/205305 A1 | 10/2020 |

OTHER PUBLICATIONS

Itsenclosures, Standard Product Data Sheet, 2011, 18 pages.
Sunbritetv, All Weather Outdoor LCD Television Model 4610HD, 2008, 1 page.
Sunbritetv, Introduces Two New All-Weather Outdoor Televisions InfoComm 2008, 7 pages.
Itsenclosures, Viewstation, 2017, 16 pages.
Novitsky, Driving LEDs versus CCFLs for LCD backlighting, Nov. 12, 2007, 6 pages.
Federman, Cooling Flat Panel Displays, 2011, 4 pages.
Zeeff, T.M., EMC analysis of an 18" LCD monitor, 2000, 1 page.
Vertigo Digital Displays, Innovation on Display FlexVu Totem Brochure, 2014, 6 pages.
Vertigo Digital Displays, FlexVu Totem Shelter, 2017, 2 pages.
Vertigo Digital Displays, All Products Catalogue, 2017, 14 pages.
Adnation, Turn Key Advertising Technology Solutions, May 23, 2017, 4 pages.
Civiq Smartscapes, FlexVue Ferro 55P/55L, Mar. 16, 2017, 4 pages.
Wankhede, Evaluation of Cooling Solutions for Outdoor Electronics, Sep. 17-19, 2007, 6 pages.
Bureau of Ships Navy Department, Guide Manual of Cooling methods for Electronic Equipment, Mar. 31, 1955, 212 pages.
Civiq, Invalidity Claim Charts, Appendix A—Appendix D, Jan. 24, 2018, 51 pages.
Civiq, Invalidity Contentions, Jan. 24, 2018, 51 pages.
Scott, Cooling of Electronic Equipment, Apr. 4, 1947, 119 pages.
Sergent, Thermal Management Handbook for Electronic Assemblies, Aug. 14, 1998, 190 pages.
Steinberg, Cooling Techniques for Electronic Equipment First Edition, 1980, 255 pages.
Steinberg, Cooling Techniques for Electronic Equipment Second Edition, 1991, 299 pages.
Yeh, Thermal Management of Microelectronic Equipment, Oct. 15, 2002, 148 pages.
Civiq, Invalidity Claim Chart, Appendix I, Mar. 22, 2018, 4 pages.
Civiq, Invalidity Claim Charts, Appendix F to H, Mar. 22, 2018, 18 pages.
Yung, Using Metal Core Printed Circuit Board as a Solution for Thermal Management article, 2007, 5 pages.
*Civiq Smartscapes, LLC V. Manufacturing Resources International, Inc.*, Memorandum Opinion re claim construction, Sep. 27, 2018, 16 pages.
*Civiq Smartscapes, LLC V. Manufacturing Resources International, Inc.*, Claim Construction Order, Oct. 3, 2018, 2 pages.
Anandan, Munismay, Progress of LED backlights for LCDs, Journal of the SID, 2008, pp. 287-310, 16/2.
Melford Technologies, Part 2, video online at https://m.youtube.com/watch?v=znlyHWozwDA, Oct. 21, 2019, 1 page.
The Free Dictionary, Bolt—Definition of bolt by The Free Dictionary, Jun. 15, 2016, 1 Page.
The Free Dictionary, Screw—Definition of screw by The Free Dictionary, Jun. 15, 2016, 1 Page.
I-Tech Company, 65" Outdoor Digital Signage Sunlight All Weather Proof LCD, 1 Page.
sunlightlcd.com, 46" All Weather NEMA4 Outdoor High Brightness (Model: GS4600L), Mar. 11, 2009, 2 Pages.
Civiq, Invalidity Claim Chart, Appendix E, Jan. 24, 2018, 28 pages.
Civiq, Smart City Devices, webpage, Jan. 30, 2019, 5 pages.
Civiq, Smart City Platform, webpage, Jan. 30, 2019, 10 pages.
Civiq, Smartscapes devices, webpage, Jan. 30, 2019, 1 page.
Miller, Adnation, photos, May 9, 2017, 28 pages.
Mentley, David E., State of Flat-Panel Display Technology and Future Trends, Proceedings of the IEEE, Apr. 2002, vol. 90, No. 4, pp. 453-459.
Rohsenow, Warren M., Handbook of Heat Transfer, Third Edition, 1998, select chapters, 112 pages, McGraw-Hill.
The American Heritage College Dictionary, Third Edition, 1993,

(56) References Cited

OTHER PUBLICATIONS excerpt, 3 pages, Houghton Mifflin Company.
*Civiq Smartscapes LLC.* V *Manufacturing Resources International, Inc.*, Petition for Inter Partes Review of U.S. Pat. No. 8,854,572 including Declaration of Greg Blonder in Support of Petition, Curriculum Vitae of Greg Blonder and Prosecution History of U.S. Pat. No. 8,854,572, Petition filed Mar. 14, 2018, 427 pages.
*Civiq Smartscapes LLC.* V *Manufacturing Resources International, Inc.*, Defendant's Amended Answer and Countercliams to Plaintiff's First Amended Complaint, Filed Apr. 24, 2018, 240 pages.

* cited by examiner

FIELD SERVICEABLE AND REPLACEABLE ASSEMBLY

CROSS-REFERENCE TO RELATED APPLICATION

This application is a continuation of U.S. Non-Provisional application Ser. No. 16/882,915 filed May 26, 2020, which is a continuation of U.S. Non-Provisional application Ser. No. 16/379,448 filed Apr. 9, 2019, which is a continuation of U.S. Non-Provisional application Ser. No. 15/886,889 filed Feb. 2, 2018, which claims the benefit of U.S. Provisional Patent Application Ser. No. 62/491,106 filed Apr. 27, 2017 and U.S. Provisional Patent Application Ser. No. 62/502,337 filed May 5, 2017, the disclosures of all of which are hereby incorporated by reference in their entireties.

TECHNICAL FIELD

Exemplary embodiments of the present invention relate generally to assemblies and methods for electronic displays.

BACKGROUND AND SUMMARY OF THE INVENTION

Electronic displays have grown in popularity not only for indoor use, but also for outdoor use. One exemplary application, without limitation, is the digital out of home advertising market where the electronic displays are increasingly replacing the use of static posters. The use of electronic displays is advantageous because they allow images to be changed quickly as well as permit the use of videos and interactive displays, among other benefits. Such displays have been placed in many locations, including but not limited, on billboards, the tops of vehicles, bus shelters, kiosks, sidewalks, stadiums, buildings, and the like.

Such outdoor, and some indoor, displays are often encased in a housing to protect them from environmental conditions and to hold various electronic components that are used to operate the displays. Despite efforts to protect the display from environmental conditions and other potential hazards, failures of the displays themselves and their related electronic components do occur. When such failures occur, it is often necessary to repair, replace, or otherwise service (hereinafter also collectively, "servicing" or "service") the displays themselves or their various electronic components. Even when such failures have not occurred, it may be desirable to access the displays or the various electronic components thereof to perform routine or preventative maintenance, or simply for inspection purposes. It may also be desirable to provide a sealed, powered, connected, and/or cooled cavity for electronic equipment. Finally, it may be desirable to change the configuration of the assembly. For example, without limitation, it may be desirable to convert a double sided electronic display into an electronic display on one side with a static poster display on the other. Current assemblies for electronic displays make it difficult or impossible to service the display and the related electronic components. Therefore, what is needed is a field serviceable and replaceable assembly for an electronic display.

Further, such assemblies are generally connected to external power sources and communications networks. Such connections often require interaction with utility lines. Interaction with these utility lines generally subjects any servicing work to additional regulations and requires technicians having specialized knowledge. Such efforts generally increase the costs, time, and effort involved with such servicing. Therefore, what is needed is a field serviceable and replaceable assembly for an electronic display.

The present invention is a field serviceable and replaceable assembly for an electronic display. A single side assembly or a back-to-back pair of side assemblies may be hingedly mounted to a frame. More specifically, the side assembly may comprise a frame configured to receive, in a back to back configuration, one or more digital displays, one or more covers, one or more poster holders (illuminated or not illuminated), or some combination thereof. A closed loop of circulating gas and an open loop of ambient air may flow through the assembly. The frame may be surrounded, at least in part, by a housing. In exemplary embodiments utilizing back-to-back side assemblies, the frame and the side assemblies may enclose an electronics cavity. Each side assembly may be hingedly connected to an upper portion of the frame and may be configured to swing outwardly to allow access to electronic components located in an electronics cavity. The cavity may be sealed, cooled, powered, and/or connected for electronic equipment. Some electronic components may be mounted to a plate located between the two side assemblies. In other embodiments, the plate (along with the electronic components) may be mounted to one of the side assemblies or may form a part of the respective side assembly.

In exemplary embodiments utilizing a single side assembly, the side assembly may be similarly mounted. However, an access panel may enclose the rear of the assembly such that the electronics cavity may also be accessed from the rear. The access panel may additionally be configured to receive a poster or a cover.

Regardless, a pair of aid devices may be utilized with each side assembly or access panel to assist in moving the side assembly between the open and the closed position as well as secure the side assembly in the open or closed position. In exemplary embodiments, a number of the electronic components may be shared for both side assemblies so as to reduce the total number of electronic components required. The aid devices may also assist in securing the side assembly in the open or the closed position. The side assemblies and/or the access panel may be opened to service the electronic components and the side assemblies. When necessary, the side assembly itself may be removed from the frame and replaced.

The one or more digital displays, one or more covers, and one or more poster holders may be mechanically attached to the frame by way of a bracket and a pin, which may be configured to serve as the main, or only, mechanical support for the one or more digital displays, one or more covers, and one or more poster holders. In this way, the digital displays, covers, or poster holders may be easily and quickly removed from the frame for servicing. In exemplary embodiments, external power and communications connections may be located on the frame or on a plate located between the one or more digital displays, one or more covers, one or more poster holders such that servicing of the one or more digital displays, one or more covers, one or more poster holders can be performed by disconnecting the power and communications at the connection point rather than disturbing the connection to the utility lines. In this way, the external power and communications connections may often remain undisturbed.

In some situations, it may be advantageous to increase the cooling capabilities of the assembly. For example, without limitation, it may be desirable to add additional temperature sensitive or heat producing equipment to the assemblies, drive the electronic displays or illumination elements at higher brightness levels, operate in extreme environments with high temperatures or high solar loading, or to provide and operate larger electronic displays in one or more of the side assemblies. Therefore, what is needed is a field serviceable and replaceable assembly for an electronic display with increased cooling.

The present invention provides a field serviceable and replaceable assembly for an electronic display with increased cooling. In exemplary embodiments, an additional open loop channel for ambient air may be added to one or both of the side assemblies mounted to either side of the frame. In exemplary embodiments, the additional open loop channel may only be added to the side assembly or assemblies comprising a cover or a poster holder, though it is contemplated that the additional open loop channel may also be added to the side assemblies comprising a digital display. It is contemplated that the additional open loop channel may be added to one or both side assemblies.

BRIEF DESCRIPTION OF THE DRAWINGS

In addition to the features mentioned above, other aspects of the present invention will be readily apparent from the following descriptions of the drawings and exemplary embodiments, wherein like reference numerals across the several views refer to identical or equivalent features, and wherein.

DETAILED DESCRIPTION OF EXEMPLARY EMBODIMENT(S)

Various embodiments of the present invention will now be described in detail with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

Figure 1:
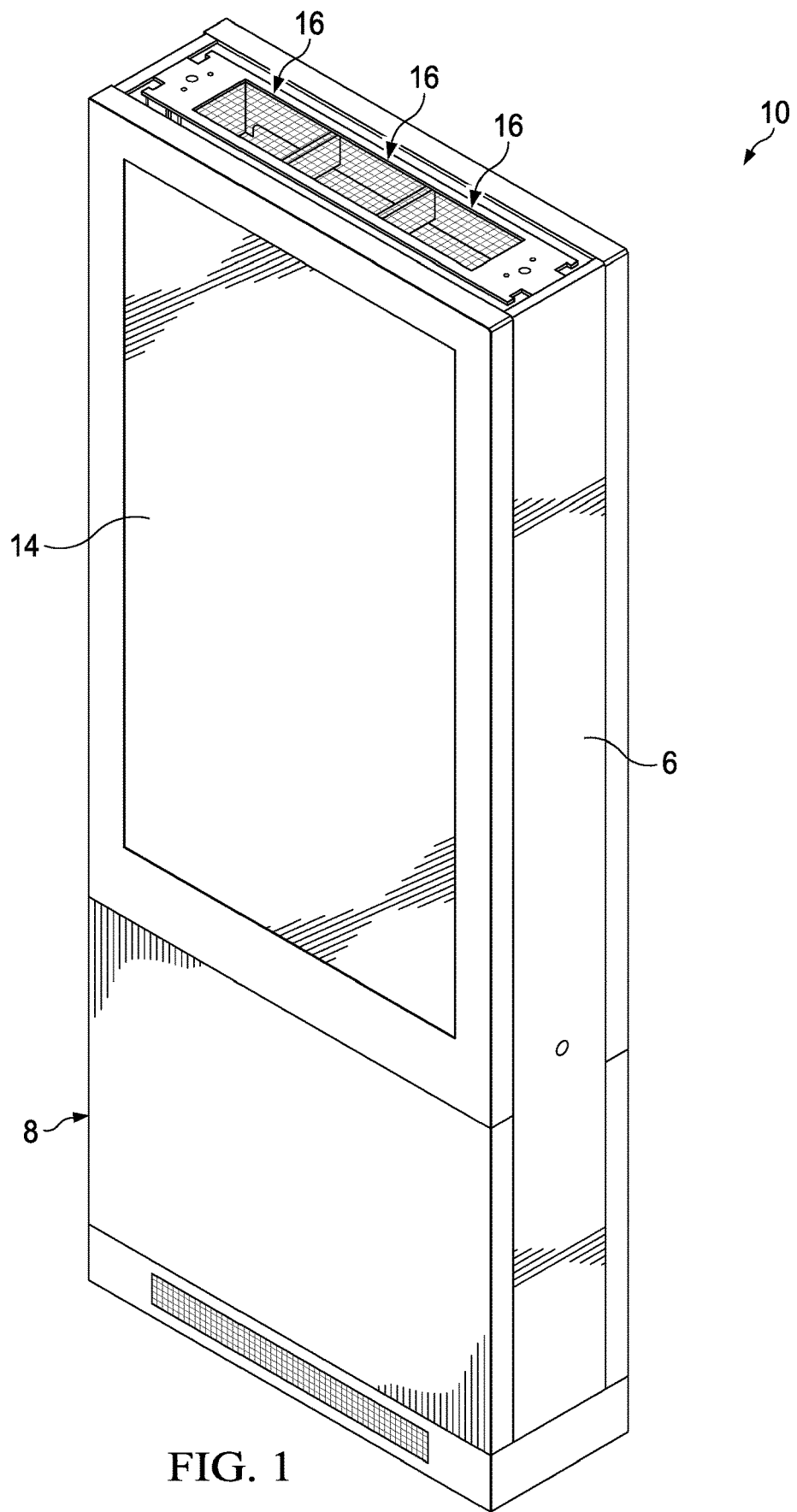
FIG. 1 is a front perspective view of an exemplary assembly in accordance with the present invention.

FIG. 1 is a front perspective view of an exemplary assembly 10 in accordance with the present invention. The assembly 10 may comprise one or more side assemblies 14 placed within a housing 6. The housing 6 may comprise a stand 8 for mounting the assembly 10 to the ground. However, in other exemplary embodiments, the assembly 10 may be mounted to another object such as, but not limited to, a bus shelter, a post, a wall, a building, a roof rack for a vehicle, or the like. Regardless, an intake 16 may be located on the top of the housing 6. As will be described in greater detail herein, an exhaust 9 may be located on the bottom of the housing 6. However, it is contemplated that the intake 16 may be located on the bottom of the housing 6 with the exhaust 9 being located on the top of the housing 6. Any other location for the intake 16 and the exhaust 9 is contemplated. Regardless, the intake 16 may likewise extend through the frame 12. Similarly, the exhaust 9 may extend through the frame 12. Alternatively, the air may flow into the exhaust 9 and out of the intake 16.

Figure 2:
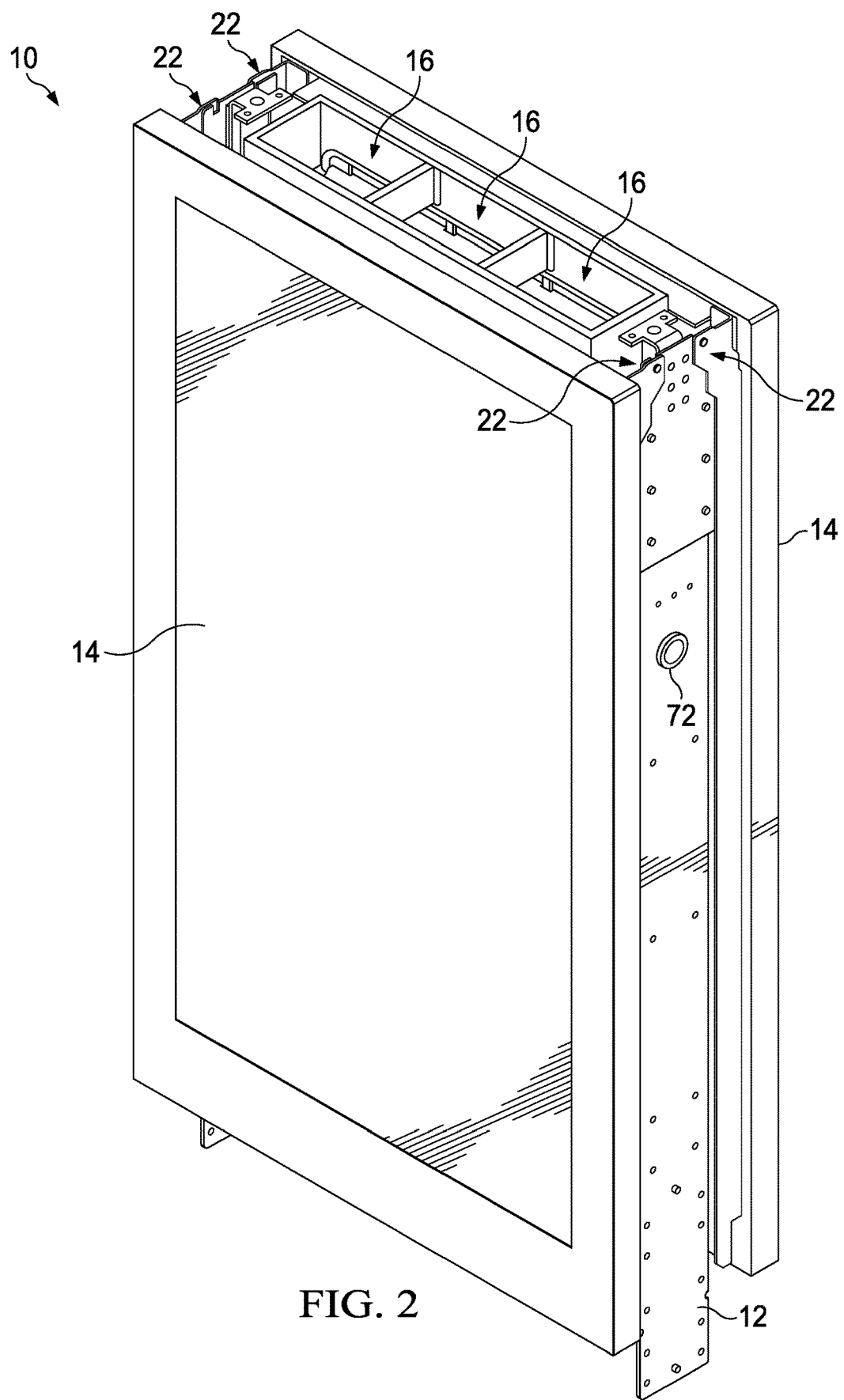
FIG. 2 is a front perspective of the assembly of FIG. 1 illustrated with the stand removed to illustrate additional components of the assembly.

FIG. 2 is a front perspective of the assembly 10 of FIG. 1 illustrated with the stand 6 removed to illustrate additional components of the assembly 10. The side assemblies 14 may be mounted to a frame 12. The frame 12 may be substantially rectangular in shape and may have interior and exterior surfaces or panels. In exemplary embodiments, the frame 12 may comprise an interconnected upper, lower, right side, and a left side piece, but may be substantially open on the front or rear sides thereof such that a side assembly 14 may be mounted to the frame 14 to substantially cover said front and rear openings. The frame 12 may be configured to receive a first and second side assembly 14 in a back to back arrangement. The side assemblies 14 may comprise digital displays, covers (i.e., access panels), poster holders (illuminated or unilluminated), some combination thereof, or the like. The poster holders may be configured to receive a static poster and may be back or edge illuminated. In exemplary embodiments, the covers and the poster holders may serve as access panels, though any of the foregoing may be moved or removed to allow access to the interior of the assembly 10. For example, without limitation, the assembly 10 may comprise two electronic displays placed back-to-back, or a single electronic display placed back-to-back with a poster holder. Regardless, the frame 12 may be configured to be connected to the stand 8, another object, or directly to the ground.

In embodiments comprising a single side assembly 14, the frame 12 may be a five-sided box. Namely, the frame 12 may comprise an interconnected upper, lower, right side, and a left side piece as well as a front or rear panel. However, the frame 12 may be substantially open on the rear or front sides thereof, respectively, such that the side assembly 14 may be mounted to substantially cover said opening.

As will be explained in greater detail herein, the assembly 10 may further comprise an electronics cavity 18 for storing electronic components 30 for operating the assembly 10. The electronics cavity 18 may be located in the space between the side assemblies 14 and the frame 12. Stated another way, the first and second side assemblies 14 may share a common electronics cavity 18.

FIGS. 1 and 2 illustrate the side assemblies 14 in a closed position such that the side assemblies 14 are in contact with the frame 12 or are located substantially parallel to the ground. As will be explained in greater detail herein, the side assemblies 14 may be hingedly mounted to the frame 12 by way of a hinging device 22. A first and second hinging device 22 may be located on either side of the frame 12 so as to connect the first and second side assembly 14 to the frame 12 in a hinged fashion. The first and second hinging devices 22 may be the same or may be different. For example, without limitation, the hinging devices 22 used to hingedly mount a side assembly 14 comprising a digital display may be the same or may be different from the hinging device 22 used to mount a display assembly comprising a poster holder. In exemplary embodiments, the hinging devices 22 may be located on an upper portion of the frame 12, such that the side assemblies 14 rotate outward along a substantially horizontal axis. In other exemplary embodiments, the hinging devices 22 may be located along an edge of the frame 12, such that the side assemblies 14 rotate outward along a substantially vertical axis. Any location of the hinging devices 22 is contemplated.

Figure 3:
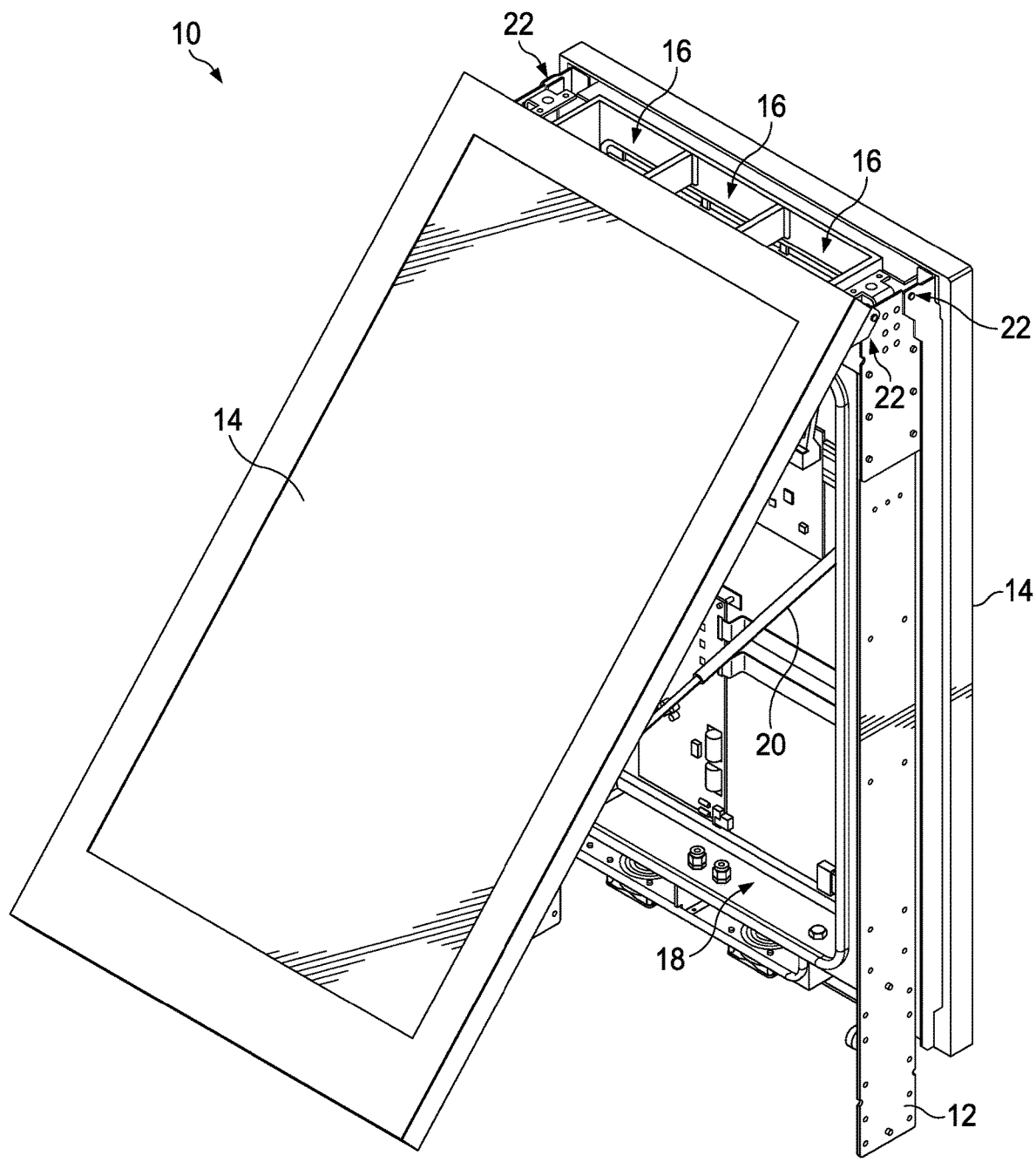
FIG. 3 is a front perspective of the assembly of FIG. 2 illustrated with one of the assemblies in the open position.

FIG. 3 is a front perspective view of the assembly 10 of FIG. 2 illustrated with one of the side assemblies 14 in an open position. The side assembly 14 may rotate via the hinging device 22 into the opened position such that the bottom of the side assembly 14 is swung outward and away from the frame 12. This may allow access to the electronics cavity 18 such that personnel may service the electronic components 30 located therein.

The assembly 10 may further comprise a pair of aid devices 20, preferably having a first end and a second end, though such is not required. In exemplary embodiments, the aid devices 20 may be gas springs, though any type of aid device is contemplated. Such aid devices 20 may include, but are not limited to, any device which utilizes a mechanical advantage in order to assist is moving the side assemblies 14 between an open position or closed positions as well as, or alternatively, to temporarily secure the side assemblies 14 in the open position or closed position. Other exemplary aid devices 20 include, but are not limited to, struts, springs, block and tackle, counterweights, levers, gears, tethers, belts, chains, motors, screws, some combination thereof, or the like.

The first end of the aid devices 20 may be mounted to either side of the side assembly 14 and the second end of the aid devices 20 may be mounted to either side of the interior of the frame 12. In exemplary embodiments, the first end of the aid devices 20 is mounted lower relative to second end of the aid devices 20, though the opposite is contemplated. The aid devices 20 may be configured to assist with movement of the side assemblies 14 between the open and the closed positions as well as temporarily securing the side assemblies 14 in the opened or the closed positions.

In exemplary embodiments, the side assemblies 14 may be lockable to the frame 12 or the housing 6 such that the side assemblies 14 cannot normally be moved from the closed position unless unlocked. This may assist in restricting access to the electronics cavity 18 to authorized personnel.

Figure 4:
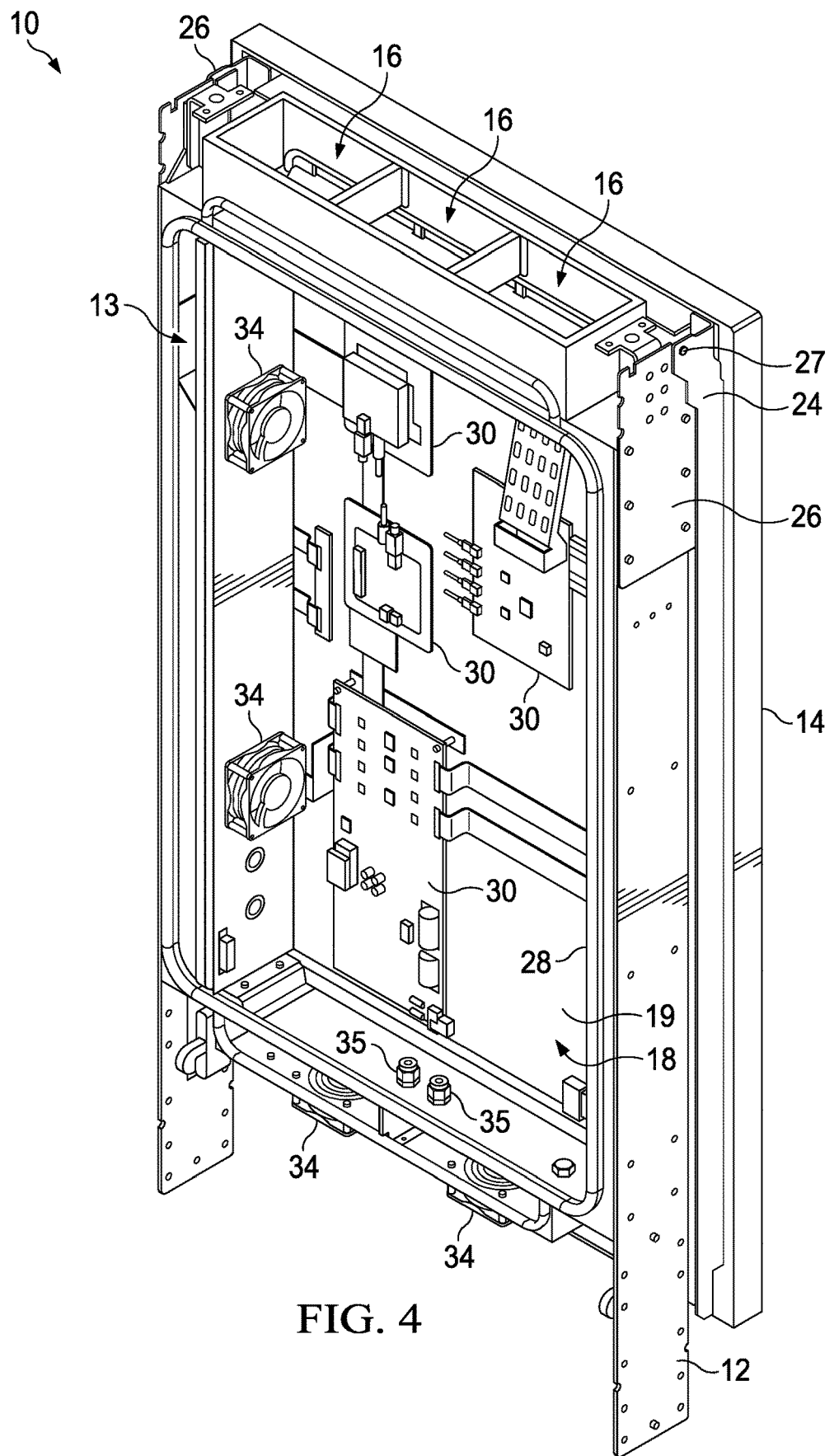
FIG. 4 is a front perspective view of the assembly of FIG. 2 illustrated with one of the assemblies removed.

FIG. 4 is a front perspective view of the assembly 10 of FIG. 2 illustrated with one of the side assemblies 14 removed so as to illustrate the electronics cavity 18. A gasket 28 may extend around the perimeter of either or both sides of the frame 12. The gaskets 28 may provide a substantially air tight seal when the side assemblies 14 are placed in the closed position. The gaskets 28 may ensure or assist in allowing the electronics cavity 18 to maintain a substantially air tight seal, though such is not required.

A plate 19 may be located in the electronics cavity 18 and the electronic components 30 may be mounted thereto. Alternatively, or in addition, an electronics plate 42 may be located in the electronics cavity 18. In exemplary embodiments, the electronics plate 42 may be mounted to the frame 12 such that the electronics plate 42 extends substantially parallel to the front surface of the electronic side assemblies 14. Similarly, in exemplary embodiments the plate 19 may be mounted to the rear surface of one or more of the side assemblies 14. However, any location and orientation of the plate 19 and the electronics plate 42 is contemplated.

The electronic components 30 may comprise any number of components used to operate the assembly 10 and its various components. Such electronic components 30 may include, but are not limited to, power sources, power distribution components, video players, video receiver boards, processors, electronic storage devices, communications equipment, wireless transmitter/receivers, network connectivity devices, printed circuit boards, and the like. In exemplary embodiments, a number of the electronic components 30 may be utilized to operate both side assemblies 14. For example, but not to serve as a limitation, at least the video players, video receiver boards, communications equipment, wireless transmitter/receivers, and network connectivity devices may be shared. This may reduce the number of electronic components 30 required. In exemplary embodiments, the plate 19 or the electronics plate 42 may comprise a server rack, though such is not required.

Each hinging device 22 may comprise a frame hinge plate 26 and a first and second display hinge plate 24. The frame hinge plate 26 may be located on the exterior panels on either side of an upper portion of the frame 12 such that the frame hinge plate 26 extends substantially perpendicular relative to the electronics plate 42. The display hinge plates 24 may be located on either side of an upper portion of each of the side assemblies 14 such that the display hinge plates 26 extend substantially perpendicular relative to the electronics plate 42. The display hinge plate 24 may comprise one or more notches or apertures corresponding to notches or apertures located on the frame hinge plate 26. Any number of fasteners 27 may extend through the corresponding notches or apertures in the display hinge plate 24 and the frame hinge plate 26 such that the frame hinge plate 26 may be hingedly secured to the display hinge plate 24. The fasteners 27 may include threaded fasteners, pins, bolts, screws, nails, or the like. This is merely exemplary, any type of hinge device 22 is contemplated. In exemplary embodiments, the frame hinge plates 26, the display hinge plates 24 and the fasteners 27 may be configured to serve as the main or sole mechanical attachment points for mounting the side assemblies 14 to the frame 12.

The hinge device 22 may provide for easy removal of one or both of the side assemblies 14 when servicing the assembly 10. The fasteners 27 may simply be removed from either side of the side assembly 14 and the entire side assembly 14 may be removed. Additionally, removal may require relatively minor additional steps such as, but not limited to, the disconnection of various electrical wires and other components as further described herein. A replacement side assembly 14 may then be installed. Installation may comprise, but is not limited to, moving the Additionally, installation of the new side assembly 14 may require relatively minor additional steps such as, but not limited to, the connection of the aforementioned various electrical wires and other components as further described herein. The side assembly 14 being serviced may then be returned to a service center for servicing. This may minimize downtime of the assembly 10.

Additionally, the assembly 10 may require connection to an external power source, communications network, and the like to operate. This may require connecting into utility lines. In exemplary embodiments, connection to said utility lines may be made through separate connectors 72 located on the frame 12, within the cavity 18, on the plate 19, on the electronics plate 42, or at another location. These connectors 72 may be connected to the other various electronic components 30 via electrical wiring, ethernet cable, telephone cable, axial cable, fiber optic cable, or the like. The disconnection and reconnection of such wiring from the connectors 72 may be required when removing or installing a side assembly 14. In this way, the connection into the utility lines may not be disturbed when servicing the assembly 10. In exemplary embodiments, the connectors 72 may also act as pass through devices 35.

Figure 5:
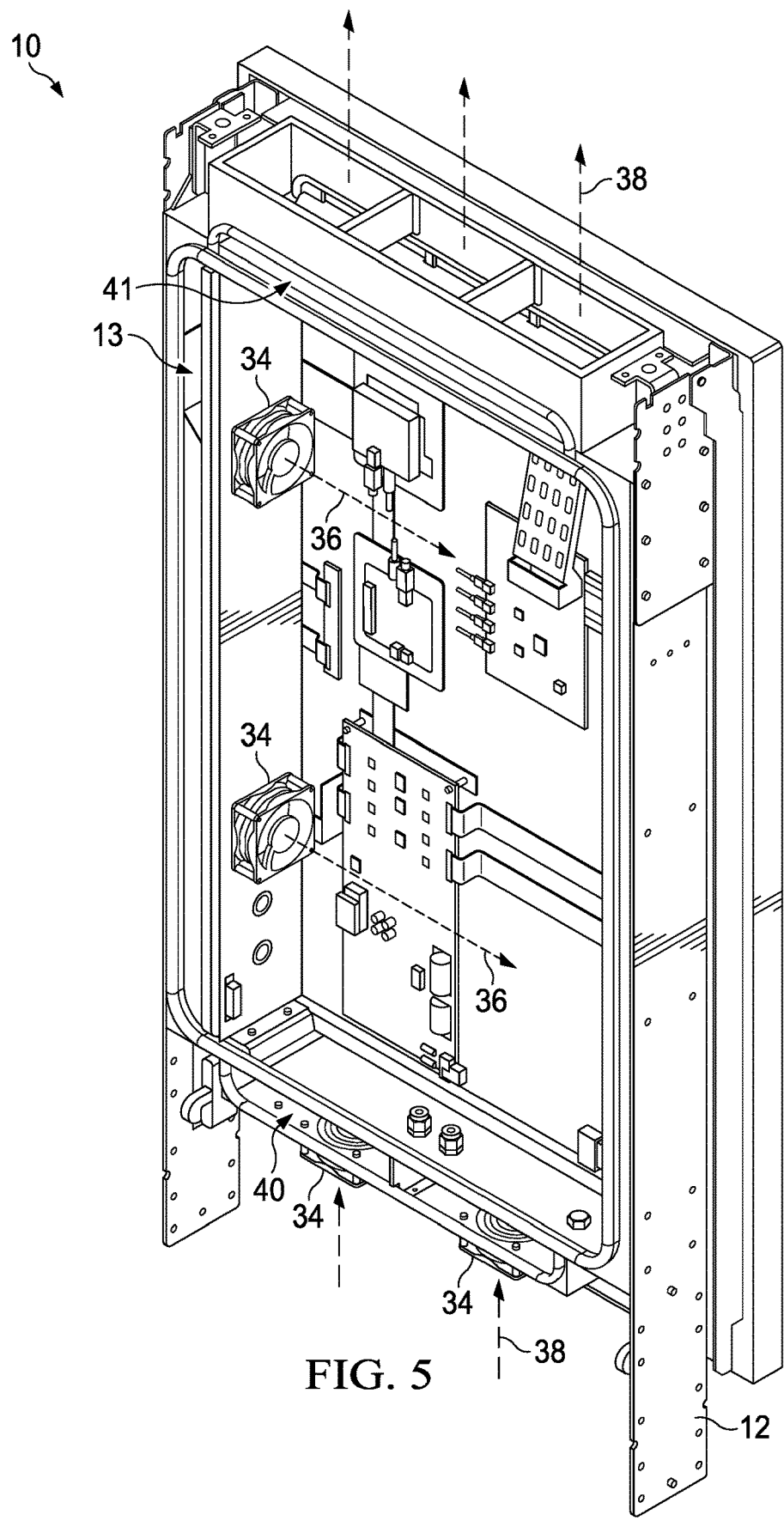
FIG. 5 is a front perspective view of the assembly of FIG. 4, illustrated with exemplary flow paths for circulating gas and ambient air.
Figure 6A:
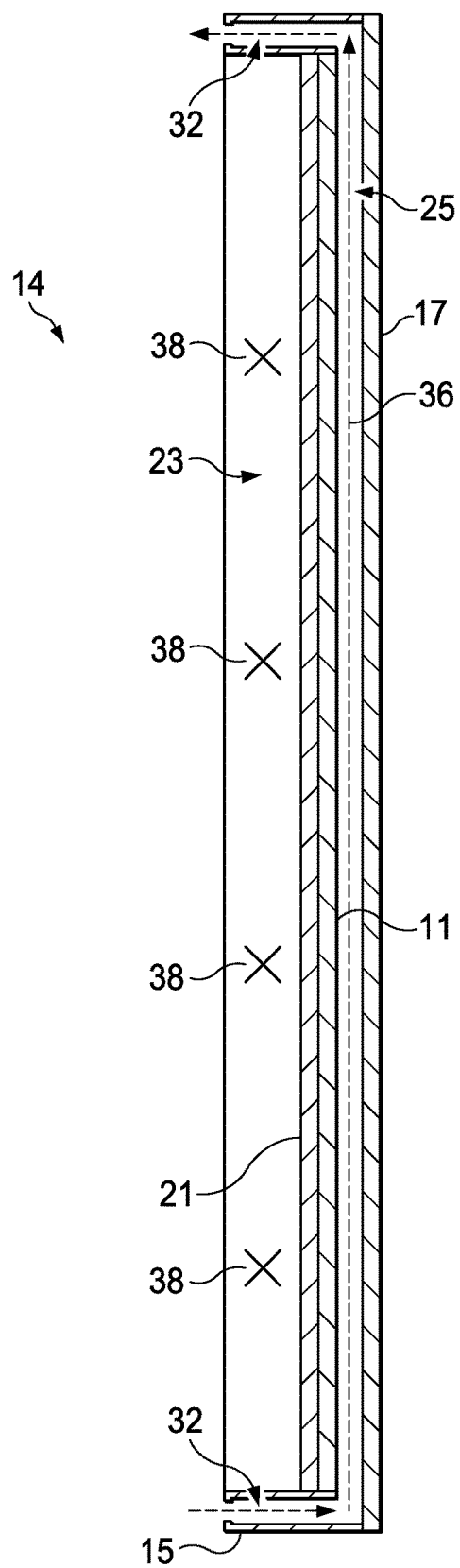
FIG. 6A is a top sectional view of an exemplary display assembly illustrated in isolation from other components to illustrate exemplary flow paths for circulating gas and ambient air.

FIG. 5 illustrates exemplary flow paths through the assembly 10 of FIG. 4. FIG. 6A illustrates a top sectional view of an exemplary side assembly 14 to further illustrate said exemplary flow paths. Each side assembly 14 may comprise a cover panel 17 that faces an intended viewer. An electronic display 11 may be located behind, spaced apart from, and substantially parallel to the cover panel 17. Cover panel 17 may be comprised of any substantially transparent or translucent material and may be comprised of multiple layers. The cover panel 17 may be comprised of a toughened material or may comprise optical adhesive placed between the multiple layers such that the cover panel 17 is strengthened against vandalism. The electronic display 11 may be any type of electronic display 11, including but not limited to, a liquid crystal display (LCD), light emitting diode (LED) display, organic LED (OLED) display, plasma display, or the like. The space between the rear surface of the cover panel 17 and the front surface of the electronic display 11 may define a first channel 25. A display assembly housing 15 may surround the electronic display 11 such that the combination of the cover panel 17 and the display assembly housing 15 substantially encloses the electronic display 11. One or more of the side assemblies 14 may further configured to receive touch input. For example, without limitation, the electronic display 11 may comprise a capacitive or resistive touch screen and related components required to operate said touch screen, though any type of touch screen is contemplated.

A backlight 21 may be located behind and substantially parallel to the electronic display 11. The backlight 21 may be spaced apart from the electronic display 11, though such is not required. A second channel 23 may be located within the side assembly 14 and may be configured to receive ambient air 38. The second channel 23 may permit ambient air 38 to flow substantially vertically through the side assembly 14 from top to bottom, or from the bottom to the top. In exemplary embodiments, the second channel 23 is defined, at least in part, by the space between the rear surface of the backlight 21 and the rear surface of the display assembly housing 15, though any location is contemplated.

A first and a second side channel 32 may extend along either side of the side assembly 14. The side channels 32 may be configured to receive circulating gas 36. In exemplary embodiments, the side channels 32 are defined, at least in part, by the space between the second channel 23 and the side of the display assembly housing 15, though any location is contemplated.

One or both sides of the frame 12 may comprise a side gap 13 located between interior and exterior side panels. As such, the assembly 10 may comprise a first and a second side gap 13, where each is located on either side of the frame 12. In other exemplary embodiments, the assembly 10 may comprise only a first side gap 13. Apertures may be located along the interior panels of the side(s) of the frame 12 having the side gap(s) 13 such that circulating gas 36 may be passed from the electronics cavity 12 into and out of the side gap(s) 13. In exemplary embodiments, the circulating gas 36 may flow from the first side gap 13, through the first side channel 32, through the first channel 25, through the second side channel 32, through the second side gap 13, through the electronics cavity 18, and be returned to the first side gap 13, thereby forming a closed loop. In exemplary embodiments where the assembly 10 comprises only the first side gap 13, the circulating gas 36 may pass directly from the electronics cavity 18 into or out of the first or the second side channel 32. Additionally, the circulating gas 36 may be split and travel through first channel 25 located in each respective side assembly 14. Stated another way, the closed loop may pass through each side assembly 14 and return to the cavity 18. It is notable that the side gaps 13 are optional.

One or more fans 34 may be mounted to said apertures in the interior panels of the side of the frame 12 to force the circulating gas 36 through the closed loop, though it is contemplated that any number of fans 34 may be placed at any number of locations along the path of the circulating gas 36.

The bottom and top of the frame 12 may similarly comprise interior and exterior panels with an upper gap 41 and a lower gap 40 located therebetween, though such is not required. Apertures may be located along the exterior panels of the bottom and top of the frame 12 such that ambient air 38 may be ingested from outside of the assembly 10 and exhausted from inside of the assembly 10. These apertures may form the exhaust 9 and the intake 16. In exemplary embodiments, ambient air 38 may be ingested from the bottom of the assembly 10 into the lower gap 40. The ambient air 38 may then travel vertically upwards through the second channel 23 in the side assembly 14 and into the upper gap 41. The ambient air 38 may then be exhausted through the intake 16, thus forming an open loop. In the exemplary embodiments, the ambient air 38 may be split and travel through each of the second channels 23 located in each of the respective side assemblies 14.

One or more fans 34 may be mounted to said apertures in the exterior panels of the bottom of the frame 12 to force the ambient air 38 through the open loop, though it is contemplated that any number of fans 34 may be located in any number of locations along the path of the ambient air 38.

In exemplary embodiments where the side assembly 14 is an electronic display, the ambient air 38 flowing through the second channel 23 may be in thermal communication with the backlight 21 so as to absorb heat generated therefrom, though such is not required. In exemplary embodiments where the side assembly 14 is an illuminated poster holder, the ambient air 38 flowing through the second channel 23 may be in thermal communication with the illumination devices so as to absorb heat generated therefrom, though such is not required. In still other exemplary embodiments where the side assembly 14 is a cover, the ambient air 38 may optionally flow through a second channel 23 located in the cover, though such is not required. Regardless, the ambient air 38 flowing through the second channel 23 may be in thermal communication with circulating gas 36 flowing through the closed loop such that the relatively cool ambient air 38 may remove heat from the relatively warm circulating gas 36. The ambient air 38 flowing through the open loop may be in thermal communication with the circulating gas 32 flowing through the closed loop so as to absorb heat therefrom while not allowing the ambient air 38 and the circulating gas 32 to substantially mix. For example, without limitation, the ambient air 28 traveling through the second channel 23 may be in thermal communication with the circulating gas 38 flowing through the cavity 18.

It is notable that the use of airflow channels, such as but not limited to, the first channel 25, the second channel 23, and the side channels 32 may not be required in embodiments where the side assembly 14 is a poster holder or cover. In such embodiments, the airflow may be directed into the remaining side assembly 14 comprising such airflow channels. If no such side assembly 14 is utilized, the airflow may simply circulate within the cavity 18. In some exemplary embodiments, the poster holder or cover may still utilize some or all of aforementioned the airflow channels. Regardless, the number of fans utilized may be reduced or increased to accommodate the number of airflow channels used.

Figure 7:
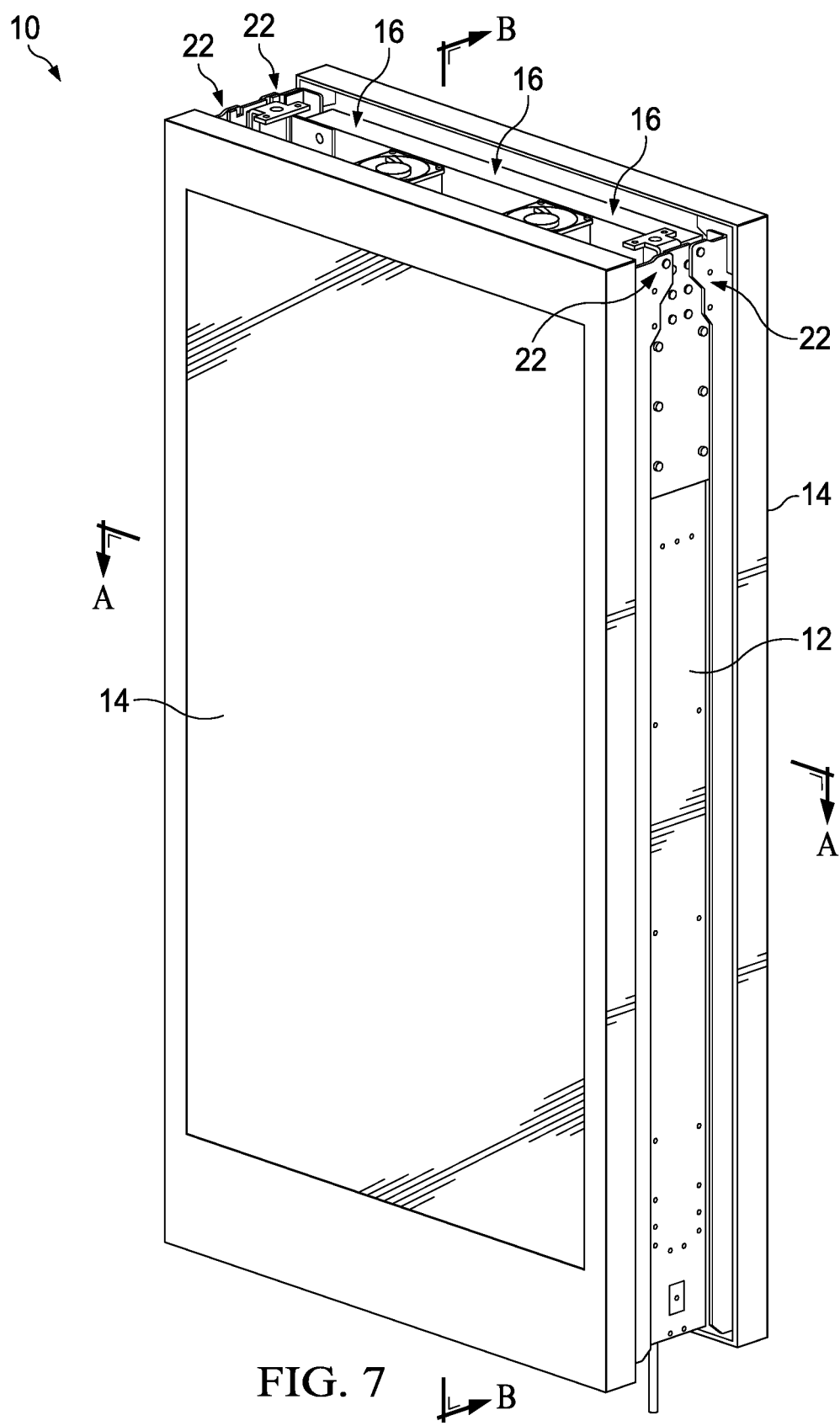
FIG. 7 is a front perspective view of another exemplary embodiment of the assembly also indicating section lines A-A and B-B.

FIG. 7 is a front perspective view similar to FIG. 1 of another exemplary embodiment of the assembly 10 also indicating section lines A-A and B-B.

Figure 8:
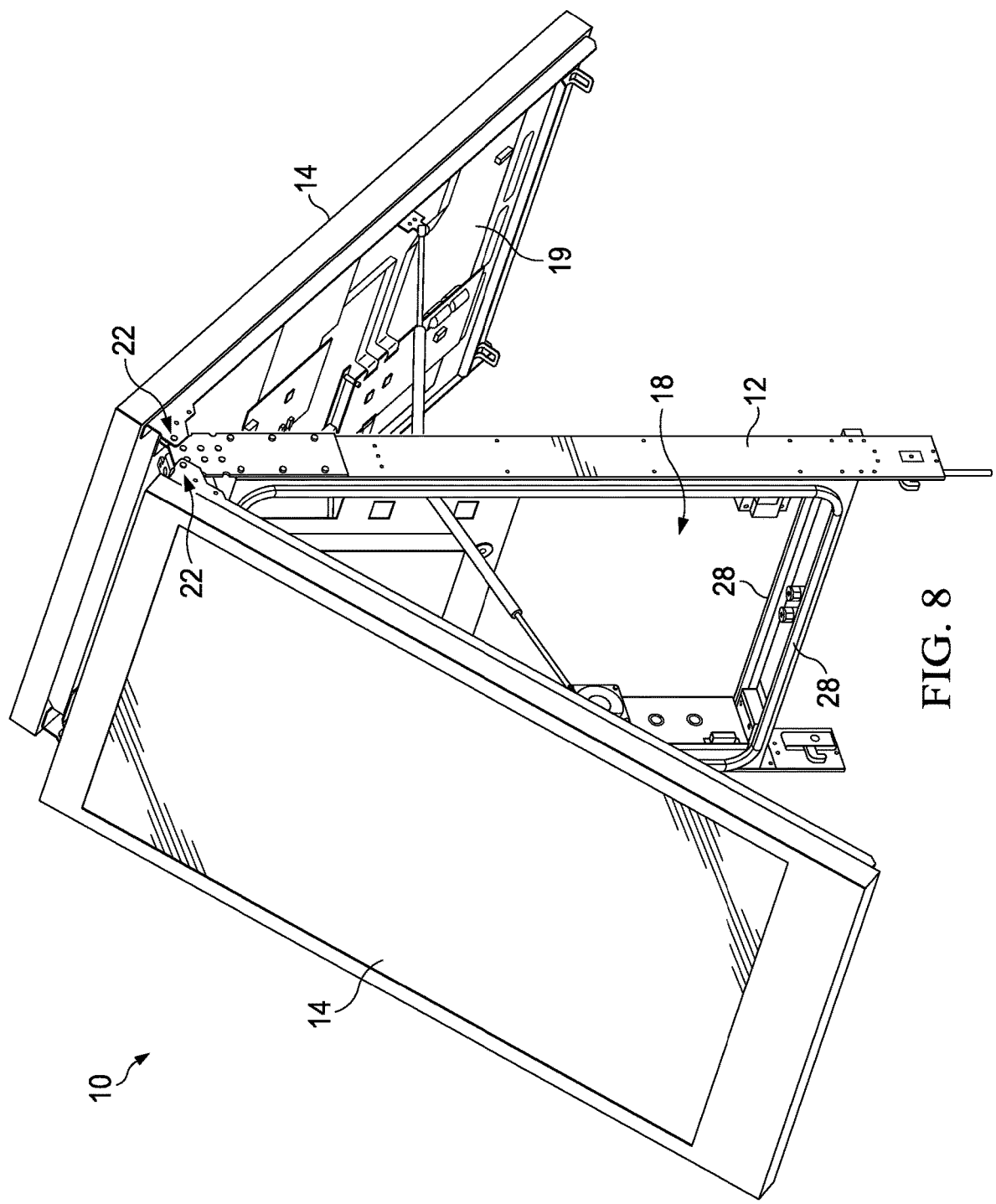
FIG. 8 is a front perspective view of the assembly of FIG. 7 illustrated with both display assemblies in the open position.

FIG. 8 is a front perspective view of the assembly 10 of FIG. 7 illustrated with both side assemblies 14 in the open position. The plate 19 may be mounted to one of the side assemblies 14. In other exemplary embodiments, the plate 19 may form a part of the side assembly 14. Many or all of the electronic components 30 may still be shared by the side assemblies 14.

The shared electronic components 30 may be located on the plate, though such is not required. In exemplary embodiments, the side assemblies 14 of the same type (e.g., electronic displays, poster holders, or covers), including the electronic components 30 located on or in the side assemblies 14, are substantially identical for the front or rear facing side assembly 14 of the same type (e.g., when both side assemblies 14 comprise electronic displays or both side assemblies 14 comprise poster holders) such that the two may be interchanged. In this way, a single type of side assembly 14 to be used to replace any of that type side assembly 14 or may be freely substituted with a different type side assembly 14. For example, without limitation, a separate front and back side assembly 14 need not be stored as spares for a single assembly 10. Instead, a single spare side assembly 14 may be used to replace either the front or back side assembly 14. This may reduce the need to store additional spare side assemblies 14. Stated another way, a side assembly 14 comprising an electronic display may be placed on either the front or the rear of the assembly. Likewise, a side assembly 14 comprising an electronic display may be freely substituted with a side assembly 14 comprising a cover.

Figure 9:
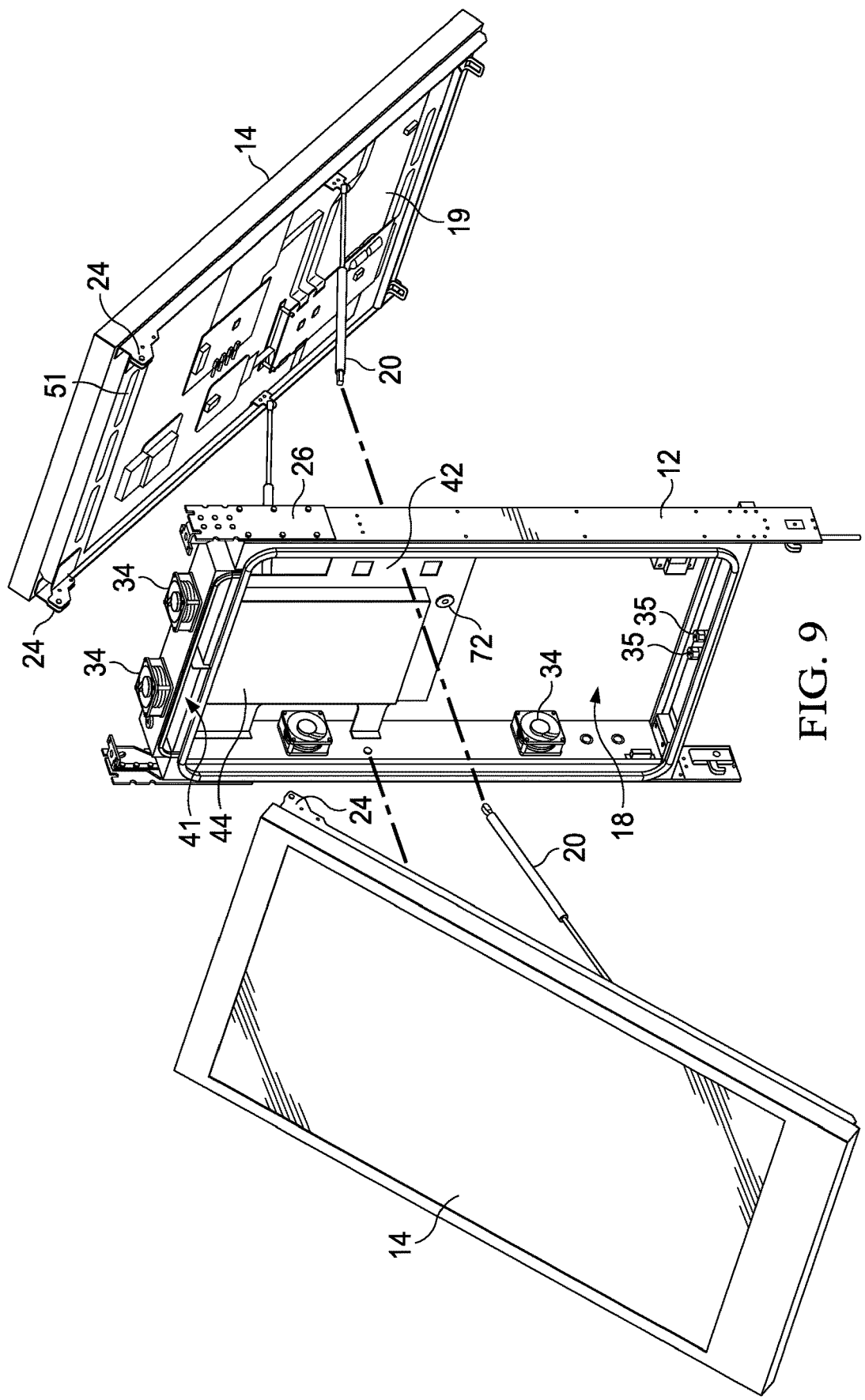
FIG. 9 is an exploded front perspective view of the assembly of FIG. 8.

FIG. 9 is a front perspective exploded view of the assembly of FIG. 8. An electronics plate 42 may be mounted to the frame 12, though such is not required. The electronics plate 42 may be located in an upper portion of the electronics cavity 18, though any location is contemplated. The electronics plate 42 may be mounted so as to extend substantially parallel with the front surface of the side assemblies 14 when the side assemblies 14 are in the closed position. The electronics plate 42 may be configured to receive the electronics components 30 and additional electronic components 44, which may be mounted thereto. In exemplary embodiments, the additional electronic components 44 may comprise customer-specific or customer-installed electronic components or other components for operating the assembly 10. However, any type of electronic components 44 and 30 are contemplated, such as but not limited to, computers, processors, routers, servers, machine to machine communications equipment, wireless connectivity devices, Bluetooth connectivity devices, near field communication devices, cameras, electronic storage devices, memory, and the like. In exemplary embodiments, the electronics plate 42 may comprise a server rack, such as but not limited to, a 1U server rack.

By placing the side assemblies 14 in the opened position, the electronics cavity 18, the plate 19, the electronics plate 42, the related electronic components 30 and additional electronic components 44 may be serviced. Additionally, the side assemblies 14 themselves may be serviced by removing the display assemblies from the hinging device 22 as previously discussed.

Various pass through devices 35 may be located in the frame 12 or other walls defining the cavity 18 such that power lines, communication lines, and the like may be passed into the cavity 18 from outside. These pass through devices 35 may be configured to provide a substantially air and water tight seal, though such is not required. In other embodiments, the pass through devices 35 may provide a level of ingress and egress protection. Any number and location of said pass through devices 35 are contemplated. This may help to reduce the number of entry and exit points in the assembly 10 and simplify the cabling. The pass through devices 35 may provide a connection/disconnection point for wiring and cabling. The cavity 18 may provide a substantially sealed, cooled, connected, and/or powered electronics cavity 18 for mounting electronic components, such as but not limited to, the additional electronic components 44 and the electronic components 30.

FIG. 9 illustrates an exemplary assembly 10 where the fans 34 for the ambient air 38 may be located on the top of the frame 12 in the apertures of the upper gap 41. Internal air intakes 51 may be provided at the side assemblies 14 which allow ingested ambient air 38 to move from the frame 12 into the side assemblies 14.

Figure 10:
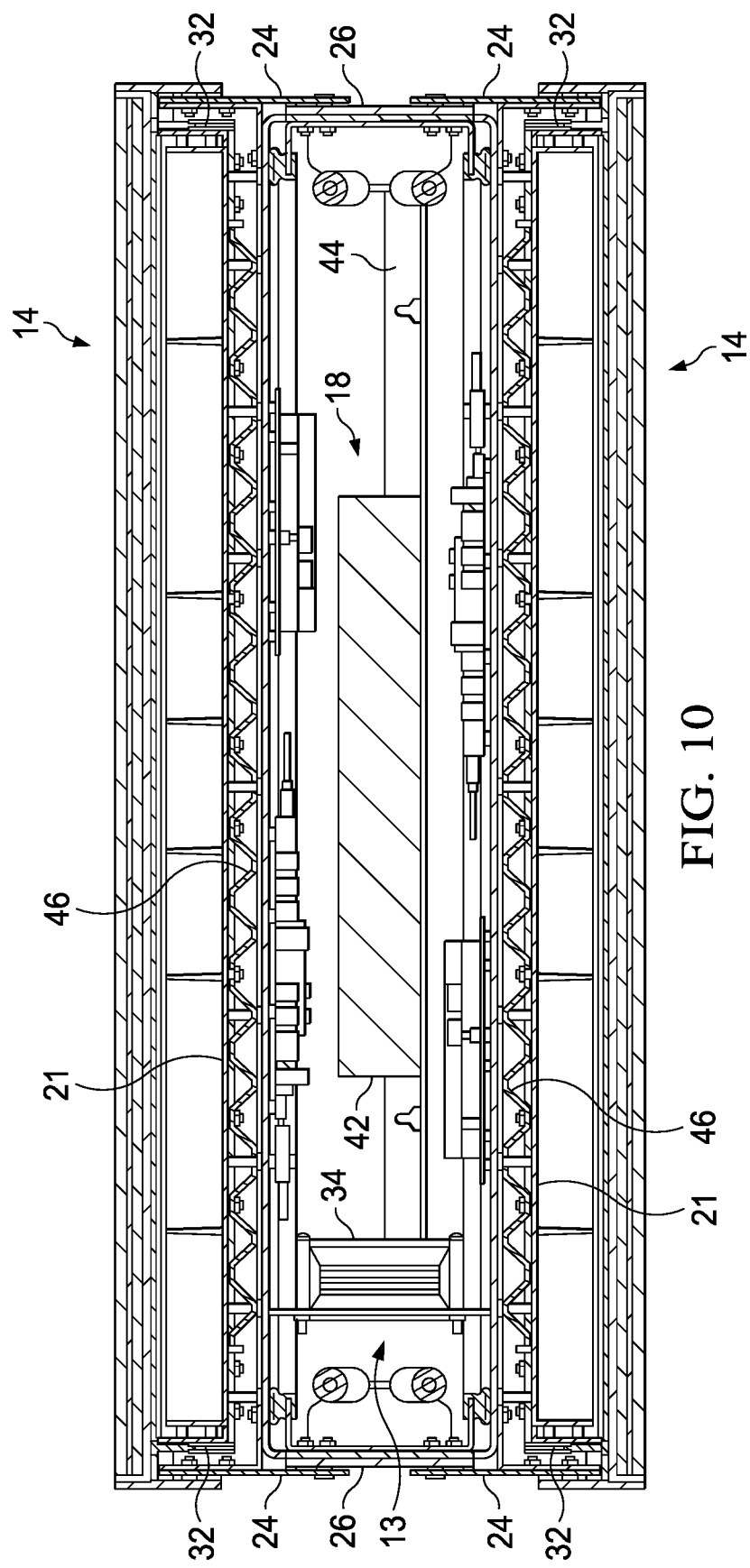
FIG. 10 is a top sectional view taken along section line A-A of FIG. 7.

FIG. 10 is a top sectional view taken along section line A-A of FIG. 7 and illustrating exemplary side assemblies 14 in the closed position, where the side assemblies 14 comprise electronic displays. The second channel 23 may comprise a corrugation layer 46 located between the backlight 21 and the electronics cavity 18. The ambient air 38 may pass through the corrugation layer 46. As illustrated in FIG. 10, the assembly 10 may only comprise the first side gap 13. It is contemplated that the first side gap 13 may be located on either side of the assembly 10 or may not be required at all. It is further contemplated that a corrugation layer 46 may be utilized in side assemblies 14 comprising a poster holder or cover.

Figure 11:
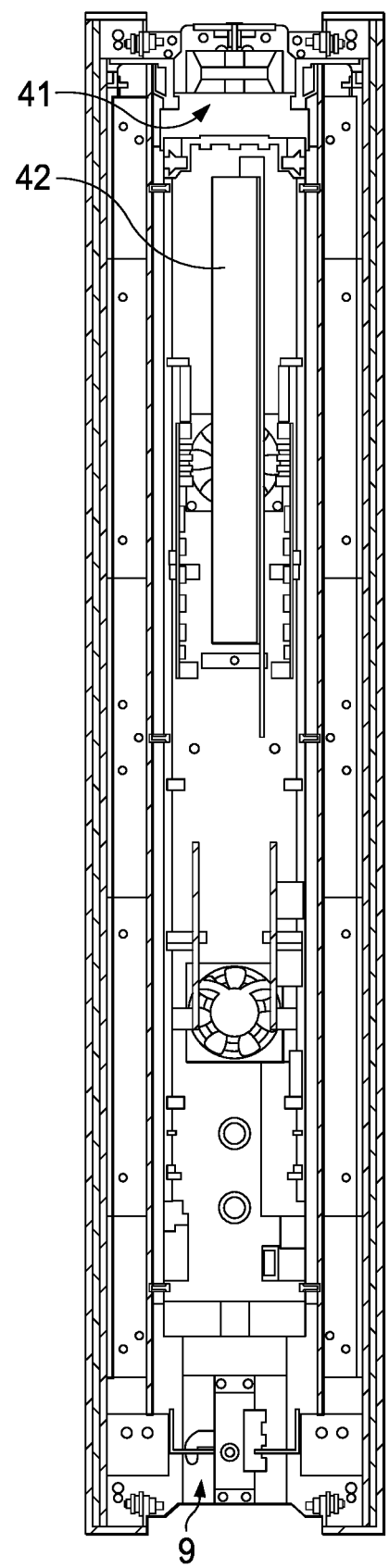
FIG. 11 is a side sectional view taken along section line B-B of FIG. 7.

FIG. 11 is a side sectional view taken along section line B-B of FIG. 7. As illustrated in FIG. 11, the lower gap 40 is optional. Instead, ambient air 38 may enter via the intake 41 and be ingested directly into the side assemblies 14 where it may travel through the second channel 23 to the upper gap 41 and exit via the exhaust 9. Alternatively, the air may enter via the exhaust 9 and exit via the intake 41.

Figure 12B:
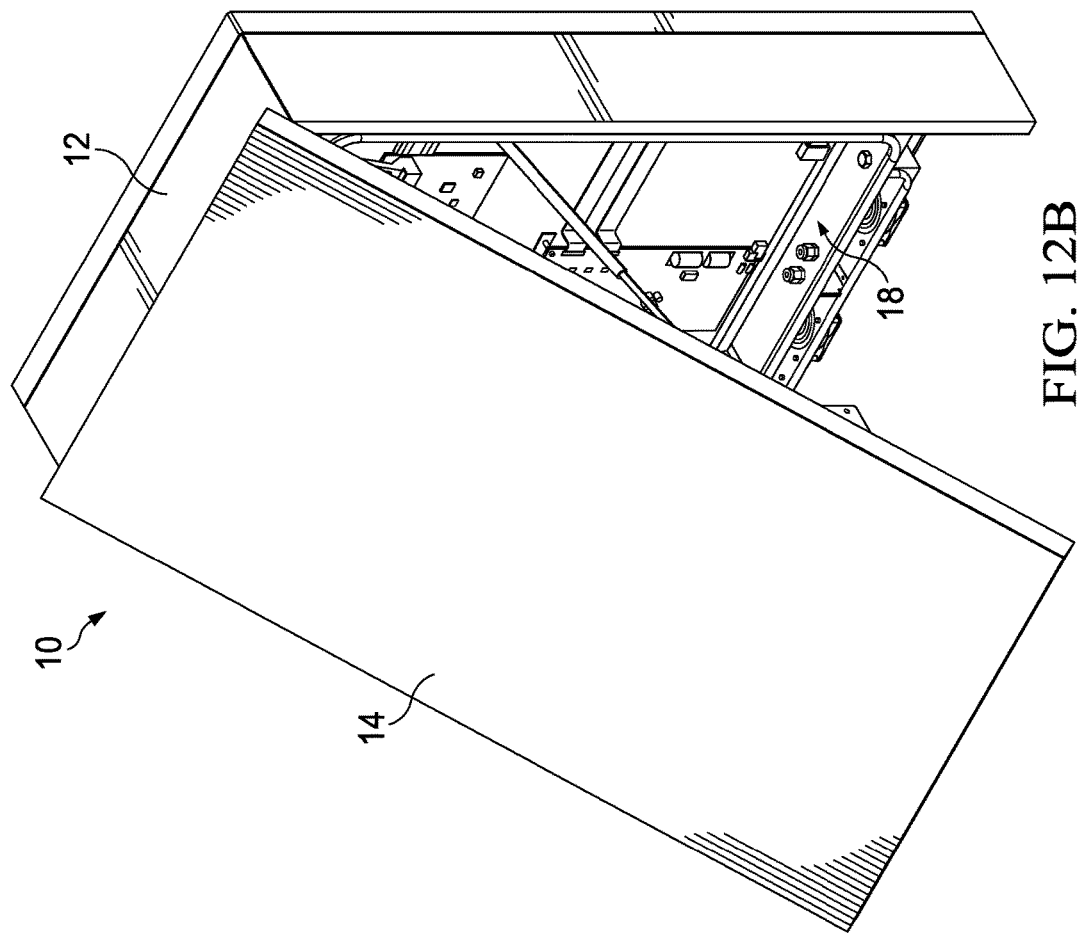
FIG. 12B is a rear perspective view of another exemplary assembly.
Figure 12A:
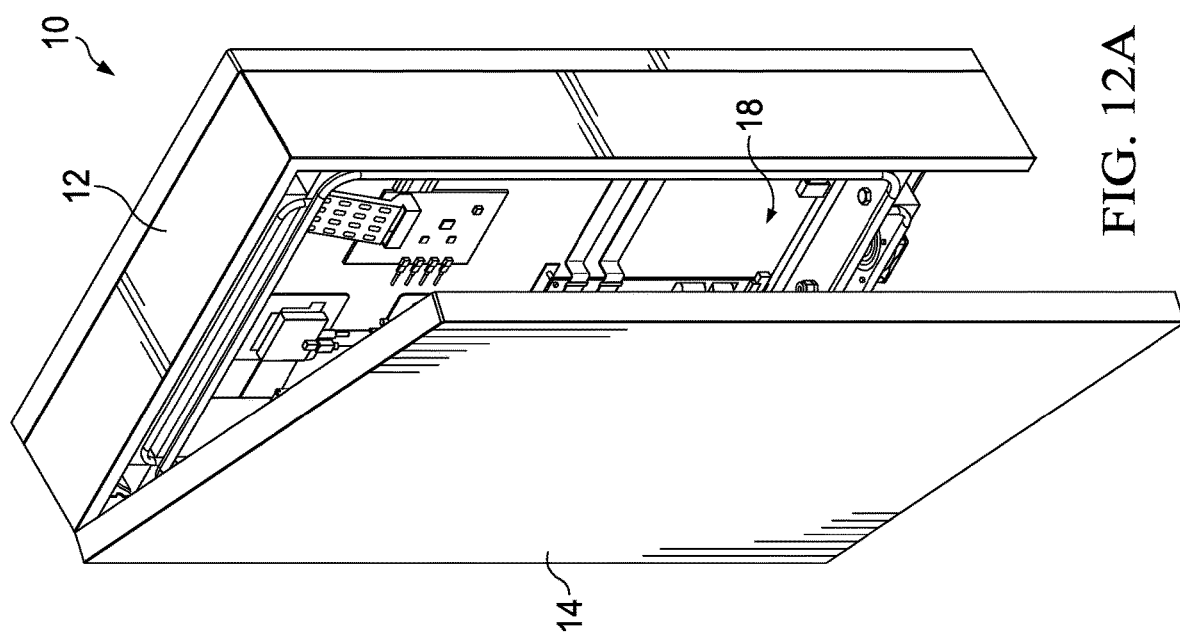
FIG. 12A is a rear perspective view of another exemplary assembly.

FIG. 12A and FIG. 12B is a rear perspective view of another exemplary assembly 10. FIGS. 12A-12B illustrates how the side assemblies 14 may be rotated outward along a substantially horizontal axis or a substantially vertical axis. The side assemblies 14 may act as an access panel. In exemplary embodiments where the side assemblies 14 are covers, the side assembly 14 may be comprised of sheet metal or black glass, though any type of material is contemplated. In exemplary embodiments comprising black glass, the black glass may be comprised of one or more transparent or translucent panels wherein one or more of the panels are printed with black ink. In exemplary embodiments, the panels may alternatively or additionally be printed with a logo or other information. The panels may be comprised of a toughened material or may comprise optical adhesive placed between two panels such that the cover is strengthened against vandalism.

Figure 6B:
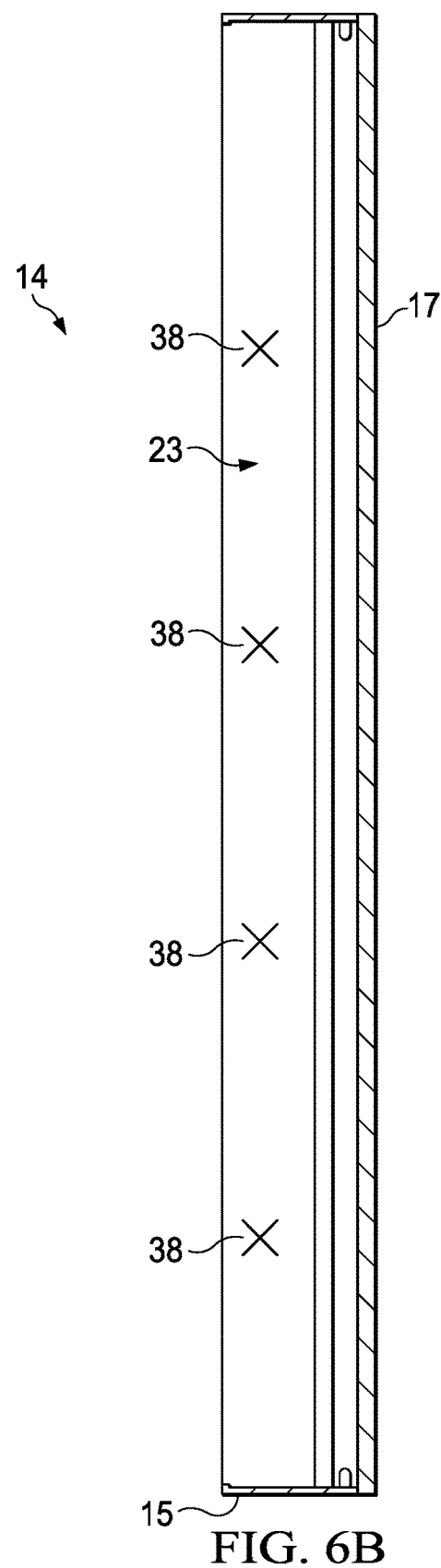
FIG. 6B is a top sectional view of an exemplary display assembly with an exemplary poster cavity.

In other exemplary embodiments, where the side assembly 14 comprises a poster holder configured to hold a static poster, the side assembly 14 may comprise a transparent cover located above a plate to define a poster cavity, which may be configured hold the poster therebetween. An exemplary poster cavity is illustrated at FIG. 6B. Illumination devices may be placed within, around, or along the poster cavity to provide backlighting or edge lighting to illuminate the poster.

In exemplary embodiments, the side assemblies 14 may swing open horizontally (as shown in FIG. 12A) or vertically (as shown in FIG. 12B). In exemplary embodiments where the side assembly 14 swings open vertically, aid devices 20 may likewise be used to assist in moving the side assembly 14 between the open and closed positions as well as securing the side assembly 14 in the open and closed positions.

Although the flow of the ambient air 38 and the circulating gas 36 may be shown and described herein with respect to particular directions and orientations, it is contemplated that the ambient air 38 and the circulating gas 36 may flow in other directions. For example, without limitation, ambient air 38 and circulating gas 36 shown as flowing clockwise may flow counter-clockwise, when shown flowing vertically from top to bottom may flow from bottom to top, when shown flowing horizontally from right to left may flow from left to right, when shown flowing vertically may flow horizontally, when shown flowing horizontally may flow vertically, and the like.

It is contemplated that the assembly 10, or various components thereof, may be adapted for and/or used with any size side assemblies 14 in any application. For example, but not to serve as a limitation, the assembly 10, or various components thereof, may be adapted for and/or used with a vehicle topper unit such as is illustrated and described in U.S. patent application Ser. No. 15/450,365 filed Mar. 6, 2017, the disclosures of which are hereby incorporated by reference in their entirety.

Figure 13:
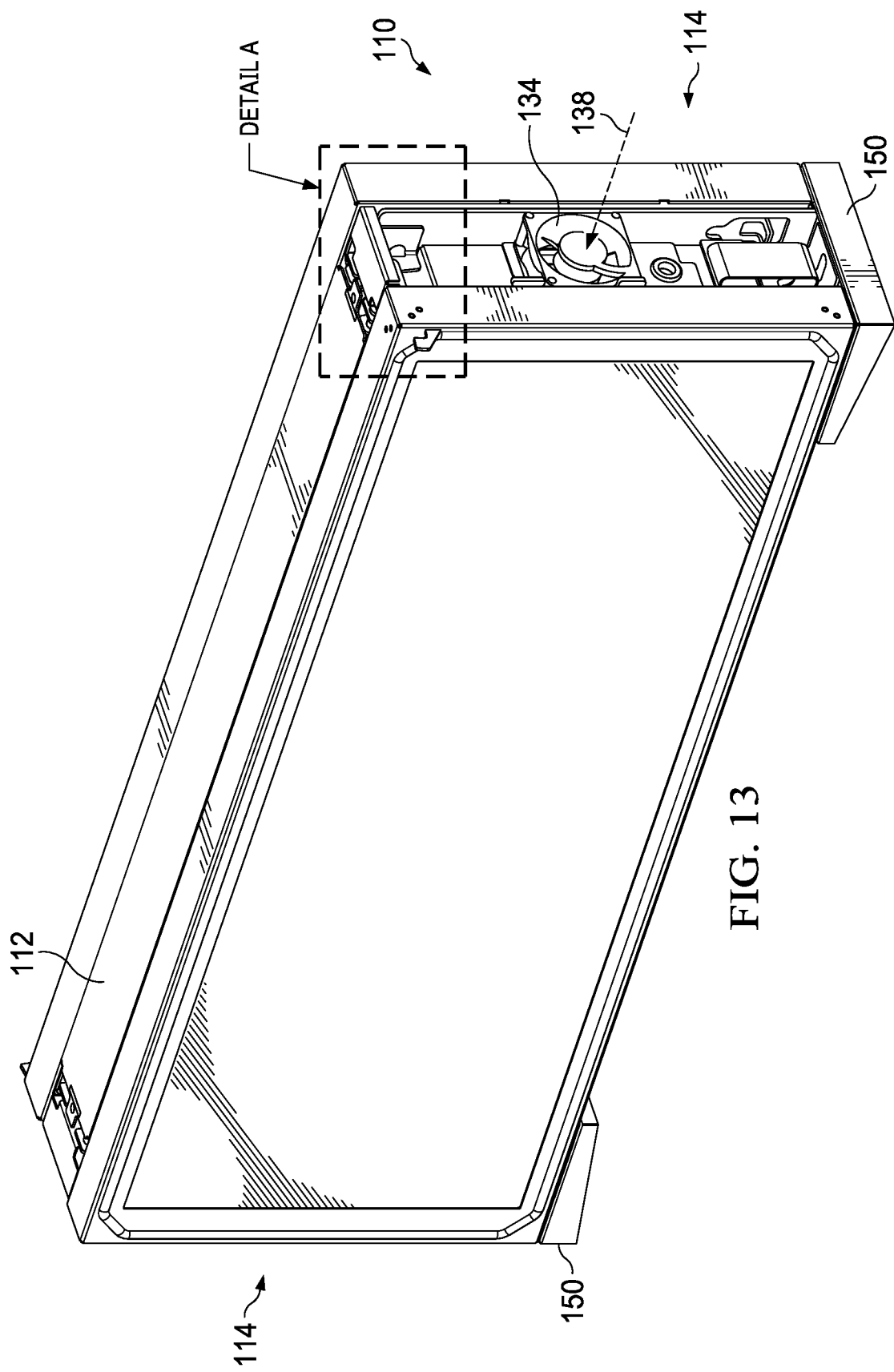
FIG. 13 is a front perspective view of another exemplary assembly also indicating Detail A.

FIG. 13 is a front perspective view of another exemplary assembly 100 also indicating Detail A. FIG. 13 through FIG. 18B illustrate and describe an adaptation of the assembly 10 for use with a vehicle topper unit as previously mentioned. Similar features have been similarly numbered but increased by 100 (e.g., assembly 10 and assembly 100). The assembly 100 may comprise a frame 112 which may be rectangular in shape, though any shape is contemplated. The frame 112 may be covered by cladding that forms a housing. The cladding may provide an aesthetically pleasing appearance and may improve aerodynamics. The frame 112 may be adapted to be mounted to the roof of a vehicle, though such is not required. A first and second side assembly 114 may be attached to the frame 112, though any number of side assemblies 114 are contemplated. In exemplary embodiments, the first and second side assemblies 114 are placed back-to-back on either side of the frame 112. The assembly 100 may further comprise a pair of mounting devices 150. In exemplary embodiments, the mounting devices 150 may be located on the underside of the frame 112 and may be feet configured to permit the assembly 100 to be mounted to the roof of a vehicle, though any type of mounting device 150 is contemplated.

A fan 134 may be located on an aperture in the frame 112 and may be configured to permit the ingestion of ambient air 138. Once ingested, the ambient air 138 may travel horizontally through channels in the side assemblies 114 and exit through apertures on the other end of the frame 112. This may form an open loop. It is contemplated that the fan 134 may be located at any location along the path of the ambient air 138.

Figure 14:
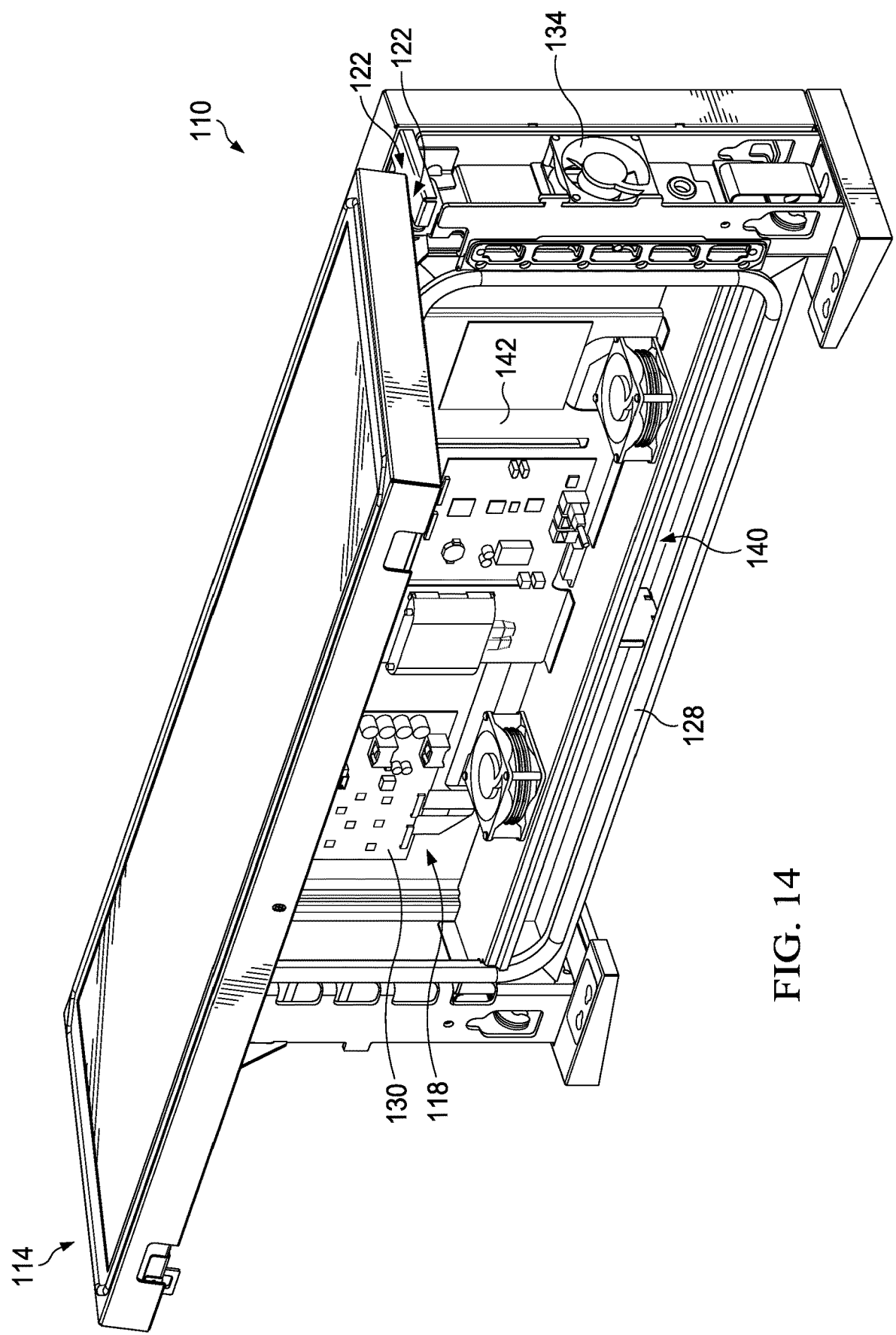
FIG. 14 is a front perspective view of the assembly of FIG. 13 illustrated with one of the display assemblies in the open position.

FIG. 14 is a front perspective view of the assembly 100 of FIG. 13 illustrated with one of the side assemblies 114 in the open position. The side assemblies 114 may be hingedly mounted to the frame 112 by way of a hinging device 122. The hinging device 122 may permit the side assemblies 114 to be moved between a closed position, wherein the respective side assembly 114 rests against or is located in close proximity with the frame 112 and/or where the front surface of the respective side assembly 114 is substantially perpendicular to the ground, and an open position wherein the respective side assembly 114 is rotated outwardly from the frame 112 and/or at least one edge of the side assembly 114 is moved away from the frame 112. A gasket 128 may extend around the perimeter of the surfaces of the frame 112 which contact the side assemblies 114. The gaskets 128 may be configured to provide a substantially air tight seal in the electronics cavity 118 when the side assemblies 114 are located in the closed position.

An electronics cavity 118 may be located between the rear surfaces of the side assemblies 114. The electronics cavity 118 may comprise a plate 142 that is configured to receive a number of electronic components 130 or additional electronic components 144 which may be mounted thereto. In exemplary embodiments, the plate 142 may be mounted to the frame 112. In other exemplary embodiments, the plate 142 may be mounted to, or form a part of, one of the side assemblies 114. Various pass through devices 135 may be located in the walls defining the cavity 118 such that power lines, communication lines, and the like may be passed into the cavity 118 from outside. The pass through devices 135 may be configured to provide a substantially air and water tight seal or otherwise provide ingress and egress protection. This may help to reduce the number of pass through points in the assembly 100 and simplify the cabling. Additionally, the pass through devices 135 may provide a single or limited number of connection or disconnection points for removing the wiring for servicing the side assemblies 114. In exemplary embodiments, the electronics cavity 118 may provide a cooled, powered, connected, and/or sealed area for electronic components, such as but not limited to, the electronic components 130 and the additional electronic components 144.

When either or both the of side assemblies 114 are placed in the open position, the electronics cavity 118 may be exposed. This may allow access to the electronics cavity 118, the plate 142, and the electronic components 130 such that personnel may service the electronic components 130 located therein. In exemplary embodiments, the side assemblies 114 may be selectively locked to the frame 112 such that the respective side assembly 114 cannot normally be moved from the closed position unless unlocked. This may assist in restricting access to the electronics cavity 118 to authorized personnel.

The frame 112 may comprise interior and exterior surfaces. In exemplary embodiments, a lower gap 140 may be located in the space between the interior and exterior surfaces of the frame 112 along a lower portion thereof. Stated another way, the lower gap 140 may be located between the bottom of the electronics cavity 118 and the bottom of the frame 112.

Figure 15:
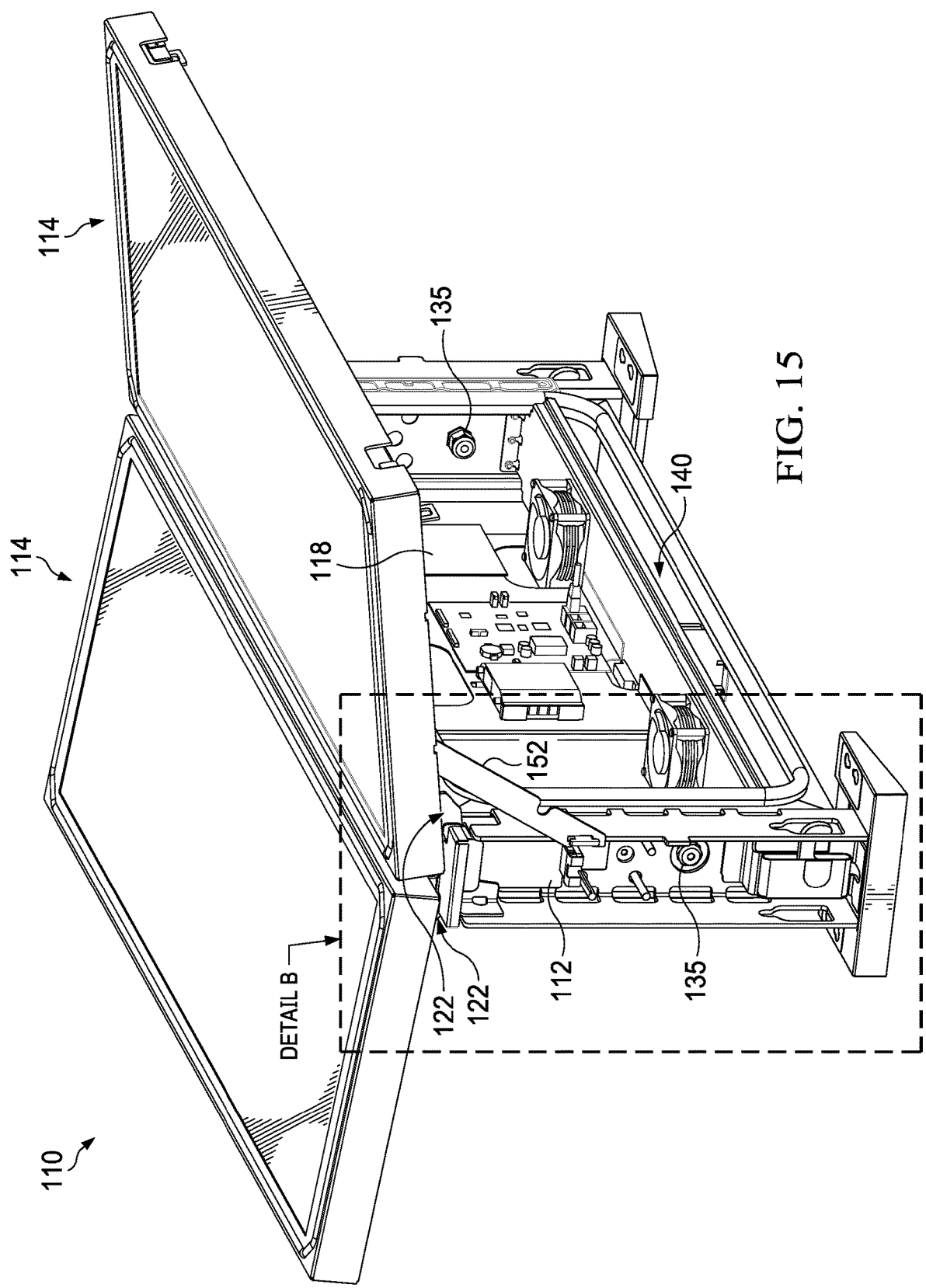
FIG. 15 is a rear perspective view of the assembly of FIG. 13 illustrated with both of the display assemblies in the open position also indicating Detail B.

FIG. 15 is a rear perspective view of the assembly 100 of FIG. 13 is illustrated with both of the side assemblies 114 in the open position and also indicating Detail B. A first and second strut 152 may extend between the frame 112 and each of the respective side assemblies 114. In other exemplary embodiments, a pair of struts 152 may be used for each respective side assembly 114. The strut 152 may be configured to temporarily secure the respective side assembly 114 in the opened position, although it is contemplated that the strut 152 may be configured to also temporarily secure the respective side assembly 114 in the closed position. Alternatively, any of the aid devices 20 may be utilized in conjunction with or in substitution of the struts 152.

In exemplary embodiments, the struts 152 may be mounted to each of the respective side assemblies 114 in a rotatable fashion. The struts 152 may be mounted in a rotatable fashion by way of a pin, bearing, hinge, fastener, or the like, though any device or mounting configuration is contemplated. Regardless, the struts 152 may be configured to be temporarily secured to each of the respective side assemblies 114 such that the respective side assembly 114 is propped or otherwise held in the open position. While the struts 152 are discussed as being mounted to each of the respective side assemblies 114 and temporarily secured to the frame 112, it is contemplated that the struts 152 may instead be mounted to frame 112 and temporarily secured to each of the respective side assemblies 114.

Figure 16:
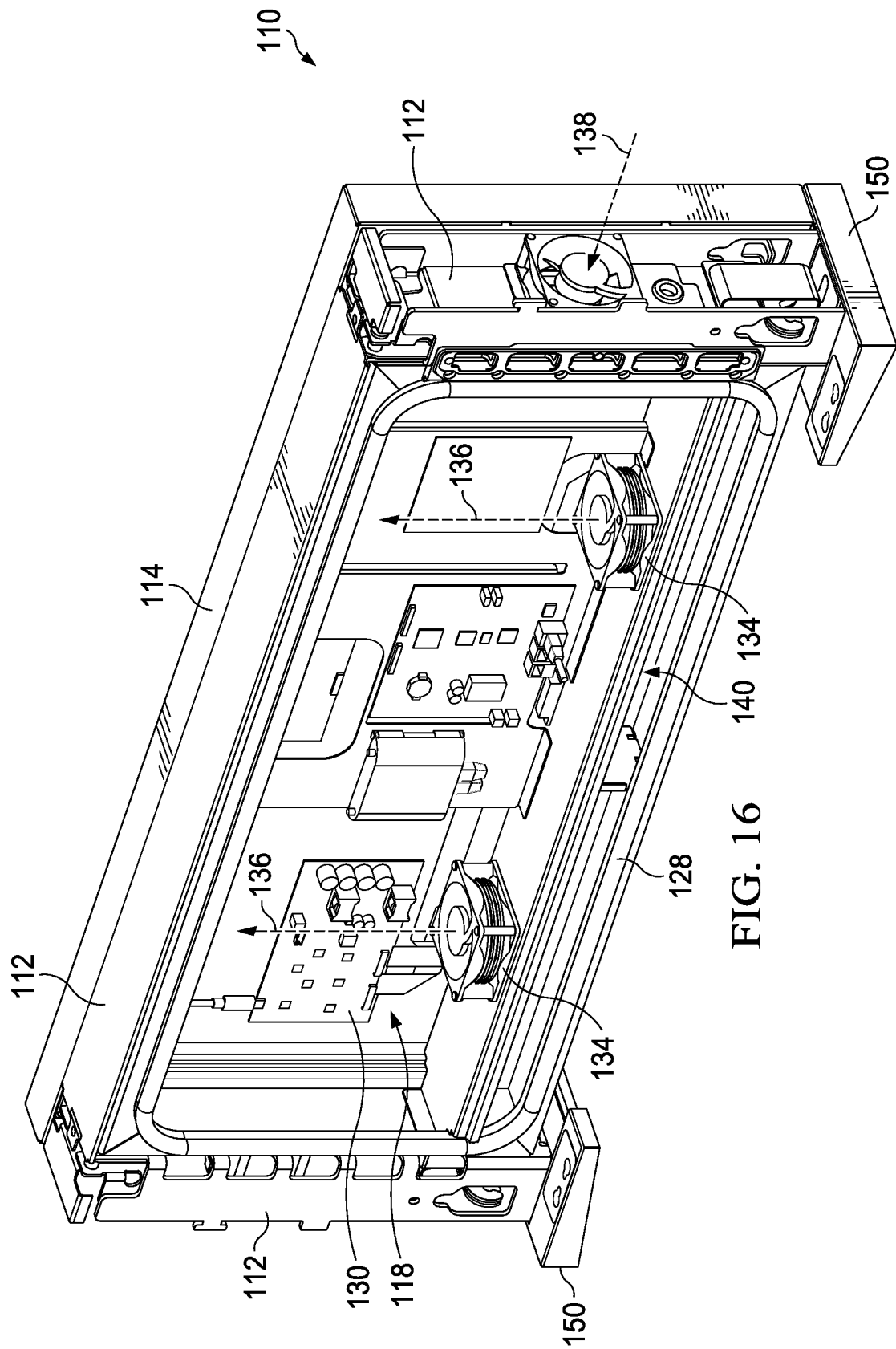
FIG. 16 is a front perspective view of the assembly of FIG. 14 illustrated with one of the display assemblies removed.

FIG. 16 is a front perspective view of the assembly 100 of FIG. 14 illustrated with one of the side assemblies 114 removed. Circulating gas 136 may travel vertically through the electronics cavity 118 where it is separated and passes through each respective side assembly 114. In exemplary embodiments, the circulating gas 136 flows through a channel between a cover glass an electronic display in each of the respective side assemblies 114. The circulating gas 136 may then travel through the lower gap 140 and be returned to the electronics cavity 118 via apertures in the interior surfaces of the frame 112, thereby forming a closed loop. In exemplary embodiments, these apertures in the frame 112 may have fans 134 mounted thereto to move the circulating gas 136 through the closed loop, though it is contemplated that the fans 134 may be located anywhere along the path of the circulating gas 136.

U.S. patent application Ser. No. 15/450,365 filed Mar. 6, 2017, the disclosures of which are hereby incorporated by reference in their entirety, describes an exemplary thermal management system for the assembly 100 including, but not limited to, open and closed loop pathways for ambient air and circulating gas.

It is contemplated that either or both of the side assemblies 114 may comprise an electronics display, a poster holder, or a cover. It is further contemplated that some or all of the electronic components 130 used to operate the side assemblies 114 may be located on the plate 142. It is also contemplated that the side assemblies 114 of the same type (e.g., comprising an electronic display, poster holder, or cover) may be substantially identical, such that the side assemblies 114 located on the left or right side of the assembly 100 may be freely substituted.

Figure 17:
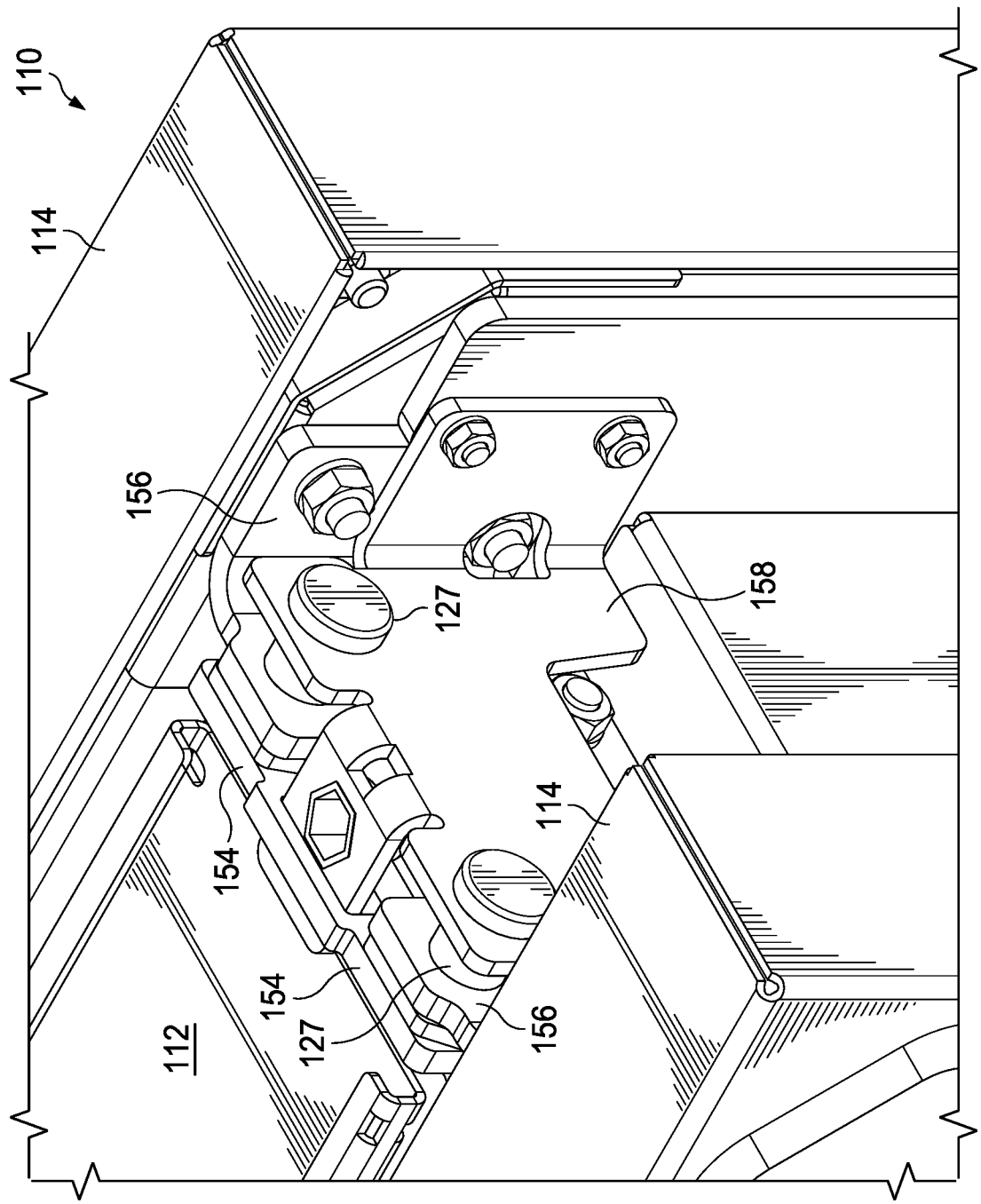
FIG. 17 is a detailed top perspective view of Detail A of FIG. 13.

FIG. 17 is a detailed top perspective view of Detail A of FIG. 13. The hinging device 122 may comprise a first and second display hinge plate 156, a first frame hinge plate 154, and a second frame hinge plate 158. Each of the first and second display hinge plates 156 may be substantially "L" shaped and may be configured to extend between a rear surface of the respective side assemblies 114 and the first frame hinge plate 154. The first frame hinge plate 154 may be mounted to either end of the frame 112. Optionally, a second frame hinge plate 158 may be located on the other side of the first and second display hinge plates 156 such that the first and second display hinge plates 156 are sandwiched between the first frame hinge plate 154 and the second frame hinge plate 158. It is contemplated that the second display hinge plate 156 may not be required, but may be used to provide added strength and stability. Additionally, the second hinge plate 158 may be configured to extend behind a portion of the side assemblies 114 so as to serve as a backstop.

A first fastener 127 may extend through the first frame hinge plate 154, the first display hinge plate 156, and the second frame hinge plate 158. Likewise, a second fastener 127 may extend through the first frame hinge plate 154, the second display hinge plate 156, and the second frame hinge plate 158. The fastener 127 may be a pin or another device permitting rotational movement of the first and second display hinge plates 156. In exemplary embodiments, the second frame hinge plate 158 may be selectively secured to the respective side assembly 114 such that the respective side assembly 114 may be temporarily secured in the closed position. The frame hinge plate 156, the display hinge plate 154, and the fasteners 127 may be configured to bear all or substantially all of the weight of the respective side assembly 114.

The design of the hinge device 122 may provide for easy removal of one or both of the side assemblies 114 when servicing the assembly 100. The fasteners 127 may be removed from either side of the respectively side assembly 114 and the entire side assembly 114 may be removed. Additionally, the disconnection of wiring, along with other steps, may be required. A replacement side assembly 114 may then be installed. Additionally, the connection of wiring, along with other steps, may be required. The side assembly 114 being serviced may then be returned to a service center for servicing. This may minimize downtime of the assembly 100.

Figure 18B:
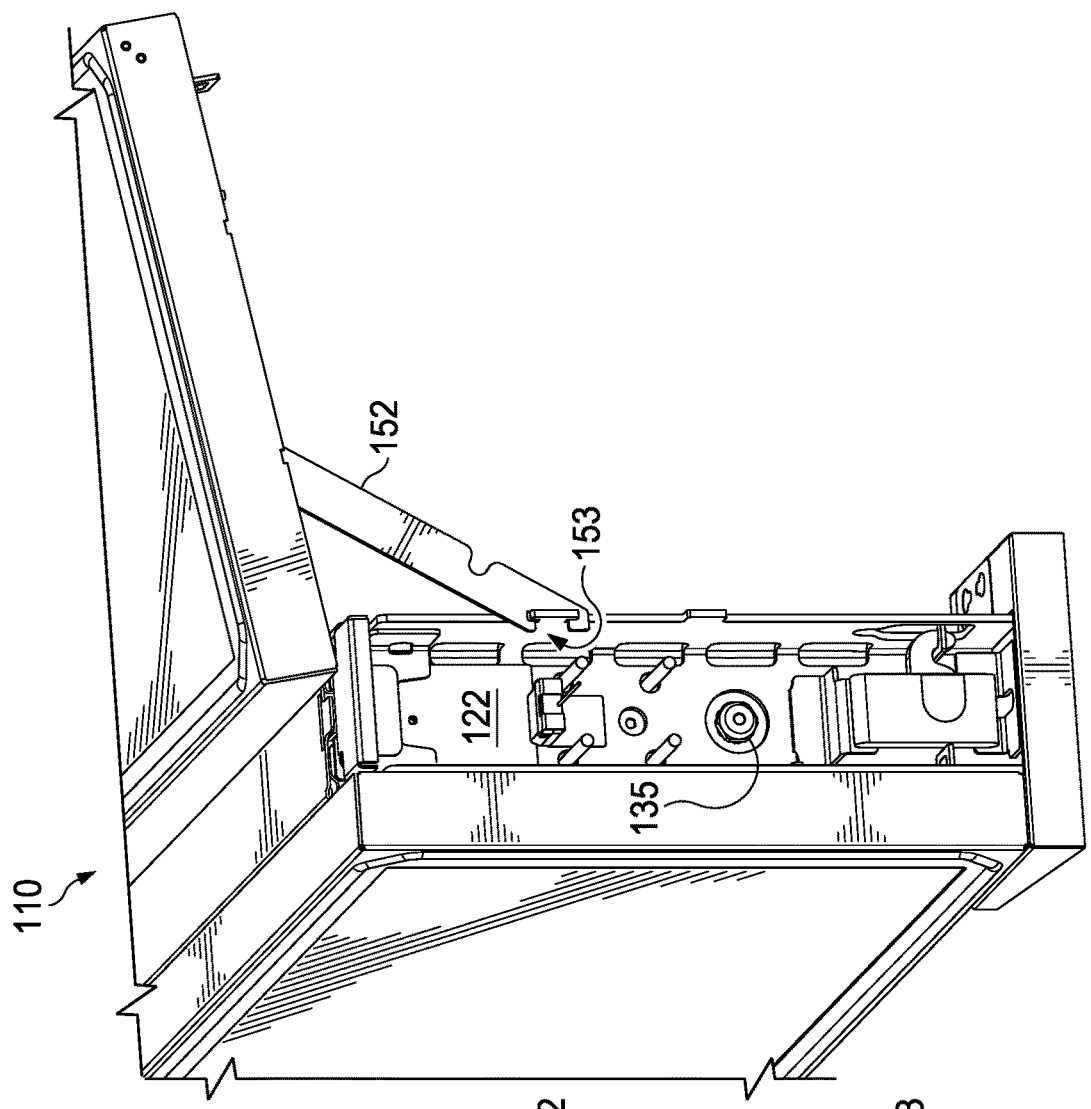
FIG. 18B is a detailed top perspective view of the assembly of FIG. 18A illustrated with the display assembly in the open position.
Figure 18A:
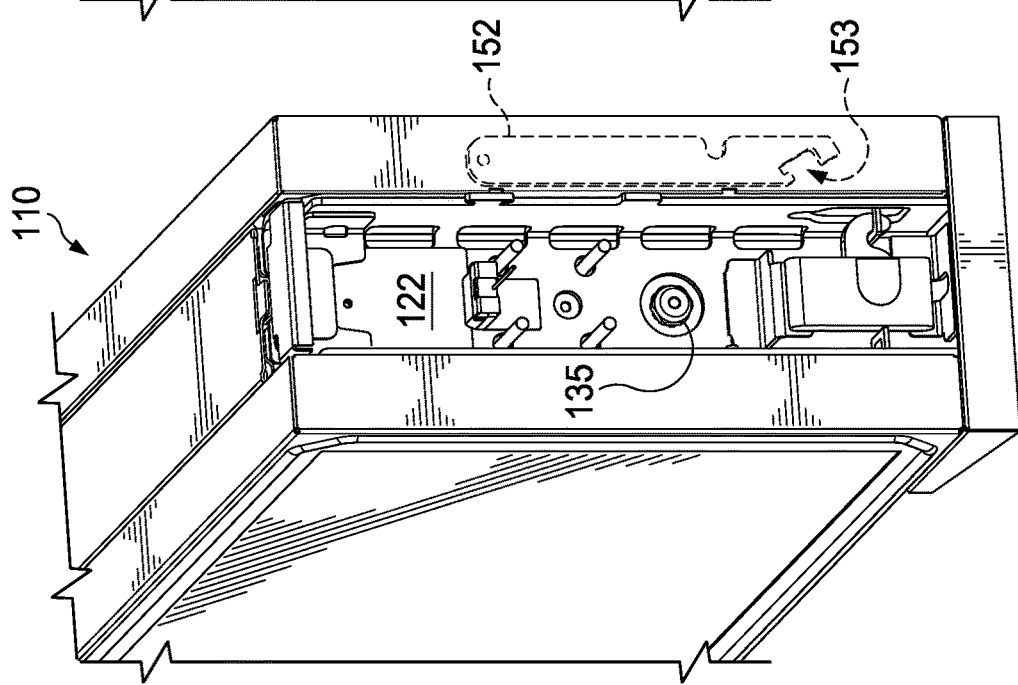
FIG. 18A is a detailed perspective view of Detail B of FIG. 15 with the display assembly in the closed position and illustrating an otherwise hidden strut.

FIG. 18A is a detailed perspective view of Detail B of FIG. 15 also illustrating the otherwise hidden strut 152. FIG. 18B is a top perspective view of the assembly 100 of FIG. 18A illustrated with the side assembly 114 in the open position. As can be seen, the strut 152 may be moved between a supporting and a stored position. The strut 152 may rotated into the stored position such that the strut 152 is substantially aligned with the side assembly 114 when the side assembly 114 in the closed position. In this way, the strut 152 is no longer bearing the weight of the side assembly 114 and may be stored within the respective side assembly 114 when the strut 152 is not being used to keep the side assembly 114 in the open position. The strut 152 may be rotated into the supporting position where the strut 152 is secured at an angle to the frame 112 such that the side assembly 114 may be propped or otherwise held in the open position. In exemplary embodiments, the strut 152 may comprise a notch 153 configured to be temporarily secured to a corresponding bracket or groove located on the frame 112 such that the strut 152 bears some or all of the weight of the side assembly 114 so as to prop or hold the respective side assembly 114 in the open position.

Figure 19A:
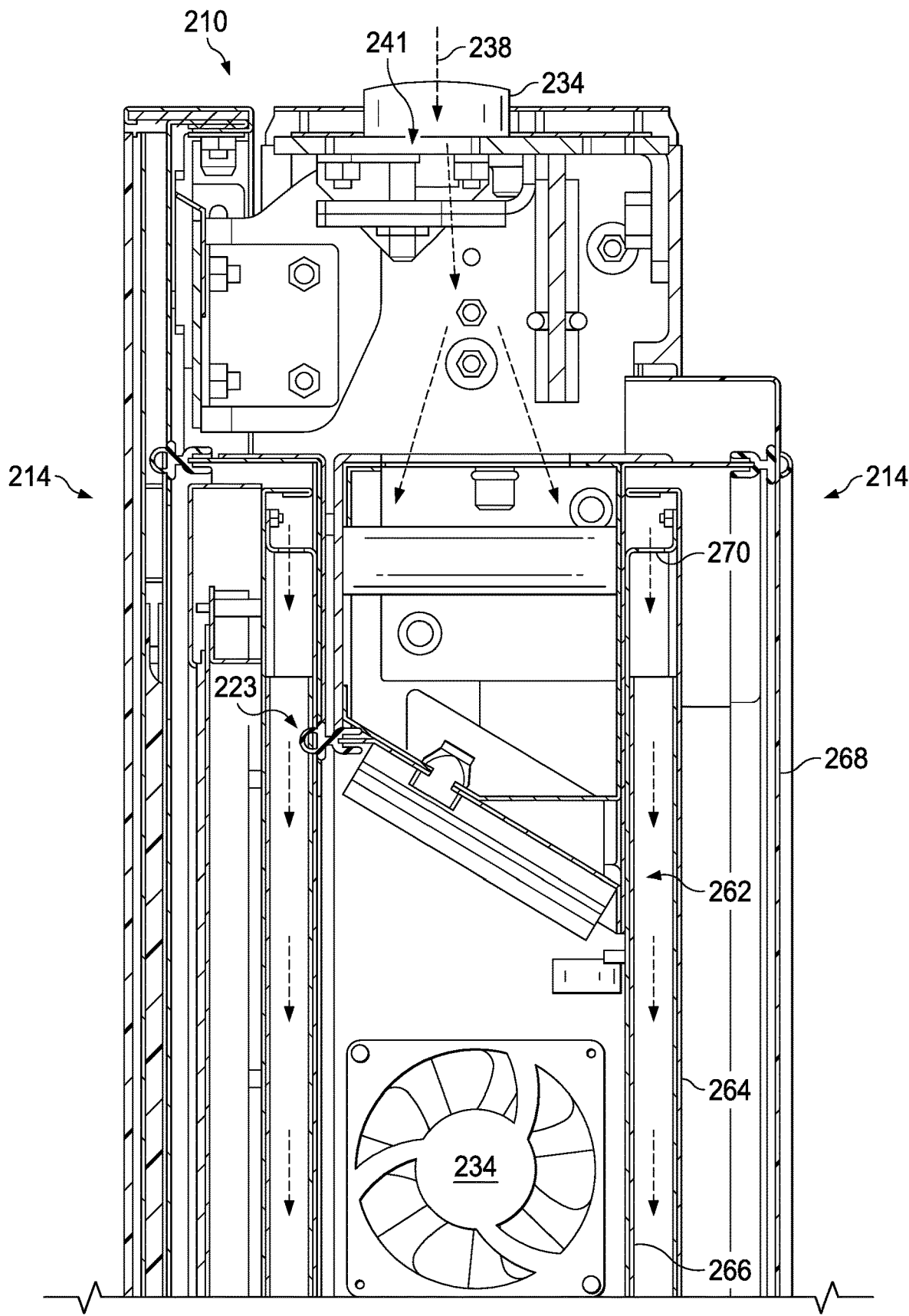
FIG. 19A is a vertical cross-sectional view of another exemplary assembly.
Figure 19B:
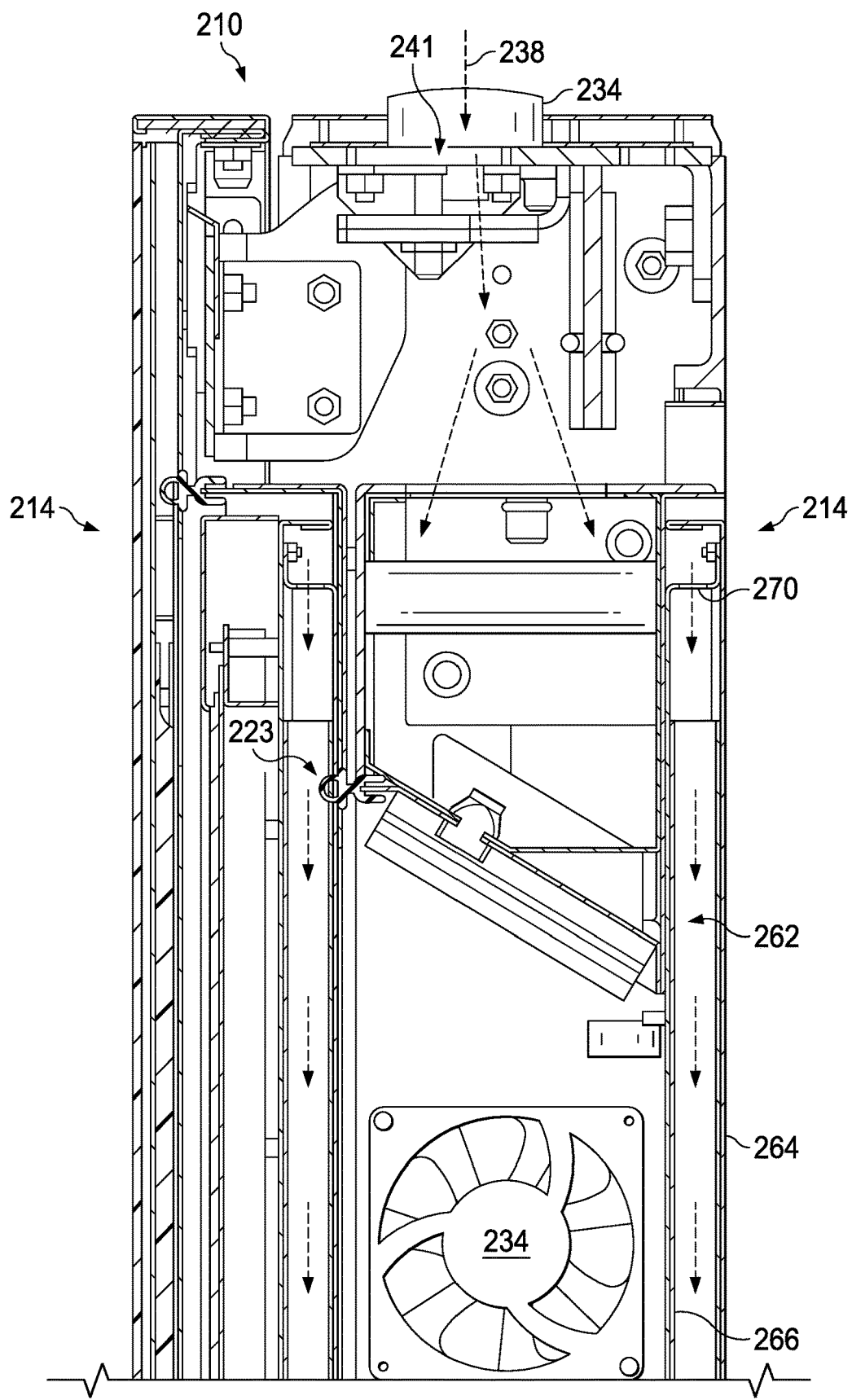
FIG. 19B is a vertical cross-sectional view of another exemplary assembly.
Figure 20:
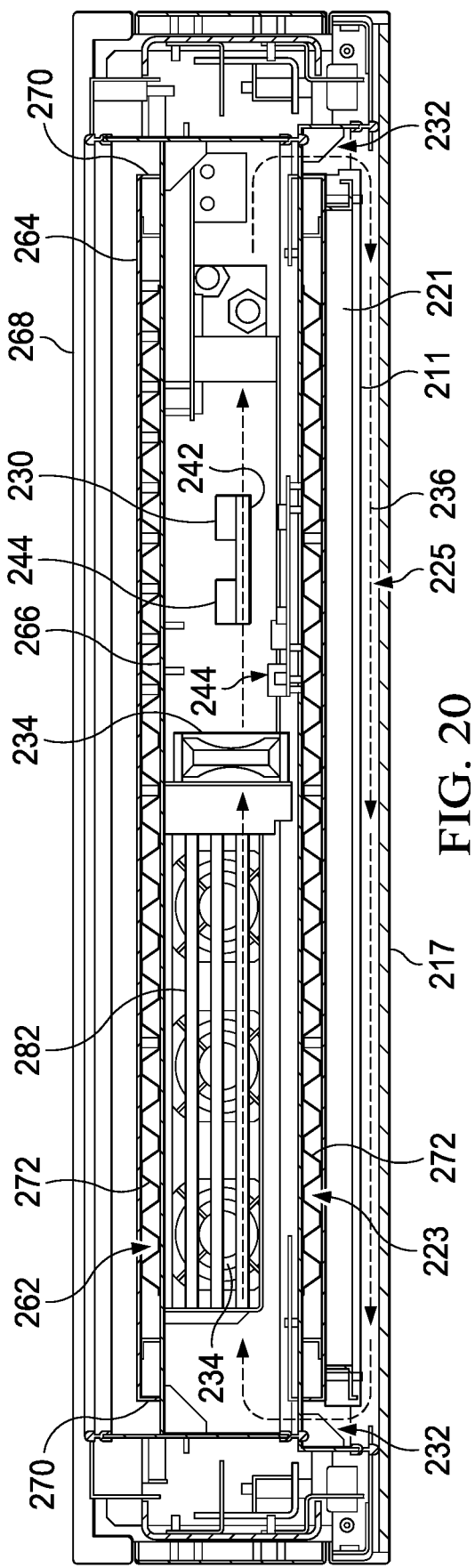
FIG. 20 is a horizontal cross-sectional view of the assembly of FIG. 19A.

FIG. 19A through FIG. 20 illustrates another exemplary embodiment of the assembly 210. Similar features have been similarly numbered but increased by 100 (e.g., assembly 10 and 110 now assembly 210). The assembly 210 may comprise a second open loop channel 262 for ambient air. The second open loop channel 262 may be located in one or more of the side assemblies 214. In exemplary embodiments, the second open loop channel 262 is located in the side assembly or assemblies 214 comprising a cover or a poster holder, though it is contemplated that the second open loop channel 262 may be located in any side assembly 214, including those comprising digital displays. The second open loop channel 262 may be located behind an open loop channel cover 264. An open loop channel plate 266 may be located behind said open loop channel cover 264. In exemplary embodiments, the open loop channel plate 266 is spaced apart from, and located substantially parallel to, the open loop channel cover 264. The open loop channel cover 264 may have substantially the same surface area as the open loop channel plate 266, though such is not required. In exemplary embodiments, the open loop channel cover 264 may be the outermost surface of the respective side of the assembly 210 and/or of the respective side assembly 214 such as is illustrated in FIG. 19B. However, in other exemplary embodiments, an outer cover 268 may be located above the open loop channel cover 264, such as is illustrated in FIG. 19A. In such embodiments, the outer cover 268 may be positioned substantially parallel with, spaced apart from, and cover the entirety of the open loop channel cover 264, though such is not required.

Regardless, the second open loop channel 262 may be defined by the space between the open loop channel cover 264 and the open loop channel plate 266. The second open loop channel 262 may further comprise one or more side panels 270 configured to extend between the open loop channel cover 264 and the open loop channel plate 266 to further define the second open loop channel 262.

Any number of electronic components or equipment 244 or 230 may be located in or near the second open loop channel 262, such as but not limited to, being mounted to the open loop channel cover 264 or the open loop channel plate 266. Such electronic components or equipment 244 or 230 may include a power supply or module, though any electronic component or equipment is contemplated. The second open loop channel 262 may be configured to transfer heat from the side assemblies 214, the electronic components or equipment 244 or 230, other components of the assembly 210 to the ambient air passing through the second open loop channel 262. The second open loop channel 262 may comprise surface features, materials, or components configured to facilitate the transfer of heat, though such is not required. These may include, without limitation, fins, thermally conductive materials, heat exchangers, or the like. In exemplary embodiments, the open loop channel 262 may comprise a corrugated layer 246. It is contemplated that any number of fans 234 may be placed at any location near or along the second open loop channel 262 to force or encourage the flow of ambient air through the second open loop channel 262.

In exemplary embodiments, the ambient air 238 may enter the assembly 210 at or near the top of the assembly 210 or the respective side assembly 214. Similarly, in exemplary embodiments, the ambient air 238 may be exhausted at or near the bottom of the assembly 210 or the respective side assembly 214 such that the ambient air 238 flows vertically downwards through the second open loop channel 262. In other exemplary embodiments, the ambient air 238 may enter the assembly 210 or the respective side assembly 214 at or near the bottom of the assembly 210 or the respective side assembly 214 and ambient air 238 may exhaust the assembly 210 at or near the top of the assembly 210 or the respective side assembly 214 such that ambient air flows vertically upwards through the second open loop channel 262. The second open loop channel 262 may share the intake 241 and the exhaust 209 such that ambient air enters via the common intake 241 and is separated into flow paths which travel into the two side assemblies 214. In other exemplary embodiments, the second open loop channel 262 may have a separate intake and exhaust.

The oppositely facing side assembly 214 may comprise an electronic display 211 located in front of a backlight 221. Circulating gas 236 may pass through the first channel 225 defined by the space between the electronic display 211 and a cover panel 217. The circulating gas 236 may pass into a cavity 218 located between the side assemblies 214. The cavity 218 may contain one or more fans 234 for moving the circulating gas through the closed loop pathway. The cavity 218 may also comprise electronic components 230 or 244 and an electronics plate 242 for mounting the same. The cavity 218 may comprise one or more heat transfer devices 282, though such is not required. In such embodiments, ambient air 238 may also be passed through the heat transfer device 282, though such is not required.

The side assembly 214 embodiment illustrated and described in FIG. 19A through FIG. 20 may be the same as, or contain the features illustrated or described with respect to, other side assemblies 14 and 114 embodiments illustrated or described herein, though such is not required. Any of the illustrated or described embodiments, or features thereof, may be utilized with any of the other embodiments illustrated or described herein.

In exemplary embodiments, the assembly 210 may be mounted in an elevated position at a downward angle. In exemplary embodiments, the assembly 210 may be mounted to a sign, pole, street lamp, street fixture, sidewalk fixture, building, structure, ground, or the like, though mounting to any surface is contemplated. The assembly 210 may be positioned at a downward angle, such that the side assembly 214 facing the ground may be viewed by those traveling underneath. The downward angle may be substantially 50 degrees, though any angle is contemplated.

In such embodiments, the second open loop channel 262 may be placed on the side assembly 214 which would normally receive the greatest solar load. For example, without limitation, the second open loop channel 262 may be placed on the side assembly 214 which would normally face upwards when mounted, though it is contemplated that the second open loop channel 262 may be located in either or both of the side assemblies 214. Such an embodiment may be used in conjunction with, but is not limited to, the exemplary assemblies 210 mounted in an elevated position at a downward angle, because the solar loading may primarily be experienced on the upward facing side assembly 214. In this way, the second open loop channel 262 may be configured to remove some or all of the solar loading experienced on the upward facing side assembly 214. In such embodiments, the upward facing side assembly 214 may comprise the second open loop channel 262 and a cover and the downward facing side assembly 214 may comprise an electronic display or static backlit poster, though any combination of side assemblies 214 is contemplated.

Any embodiment of the present invention may include any of the optional or preferred features of the other embodiments of the present invention. The exemplary embodiments herein disclosed are not intended to be exhaustive or to unnecessarily limit the scope of the invention. The exemplary embodiments were chosen and described in order to explain the principles of the present invention so that others skilled in the art may practice the invention. Having shown and described exemplary embodiments of the present invention, those skilled in the art will realize that many variations and modifications may be made to the described invention. Many of those variations and modifications will provide the same result and fall within the spirit of the claimed invention. It is the intention, therefore, to limit the invention only as indicated by the scope of the claims.

What is claimed is:

1. An interchangeable display assembly system, said system comprising:
   digital side assemblies, each comprising one or more mounting components and an electronic display;
   cover side assemblies each comprising one or more of the mounting components; and
   a frame comprising one or more complementary mounting components configured to removably mate with the mounting components of any of the digital side assemblies and the cover side assemblies such that the frame is configured to interchangeably accept any selected one of the digital side assemblies and the cover side assemblies in a universal fashion (a "first selected side assembly") at a first side thereof and any other one of the digital side assemblies, or any selected one of the cover side assemblies in a universal fashion (a "second selected side assembly") at a second side thereof to define an assembled display unit, where at least one of the first selected side assembly or the second selected side assembly comprises one of the digital side assemblies, wherein said frame comprises intakes and exhausts in direct fluid connection with an ambient environment, and wherein each of said digital side assemblies and said cover side assemblies comprise at least one internal intake which is fluidly internal, and laterally internal, to the intakes and the exhausts when connected to said frame as part of the assembled display unit; and
   an open loop airflow pathway extending through at least part of the assembled display unit, wherein said open loop airflow pathway extends from the intakes, between the first selected side assembly and the second selected side assembly of the assembled display unit, through the at least one internal intake of each of the first selected side assembly and the second selected side assembly, and to the exhausts; and
   a set of one or more fans connected to a first portion of said frame and located along the open loop airflow pathway;
   wherein said first selected side assembly is positioned back-to-back with said second selected side assembly at said frame; and
   wherein each of said first selected side assembly and said second selected side assembly are moveable relative to said frame at least in part by way of the mated mounting components between a first position adjacent to said frame and a second position away from said frame to permit access to an interior of said frame when mounted to said frame.

2. The system of claim 1 wherein:
   each of said digital side assemblies comprise a cover panel located forward of said electronic display and configured to permit viewing of images displayed at said electronic display through said cover panel;
   each of said digital side assemblies comprise a backlight located rearward of said electronic display; and
   each electronic display of each of said digital side assemblies comprise a liquid crystal display.

3. The system of claim 1 wherein:
   each of said cover side assemblies are configured to obfuscate a view therethrough.

4. The system of claim 1 wherein:
   each of said digital side assemblies comprise:
      at least a portion of a closed loop airflow pathway for circulating gas when part of the assembled display unit; and
      at least a portion of the open loop airflow pathway for ambient air when part of the assembled display unit.

5. The system of claim 4 wherein:
   each of said digital side assemblies comprise:
      a channel configured to accept the ambient air and forming at least part of said open loop airflow pathway when part of the assembled display unit; and
      a second channel configured to accept the circulating gas and forming at least part of said closed loop airflow pathway when part of the assembled display unit.

6. The system of claim 5 wherein:
   said frame defines at least a portion of a cavity configured to accept the circulating gas and forming at least part of said closed loop airflow pathway.

7. The system of claim 6 further comprising:
   an electronics plate extending from said frame and within the cavity, wherein said electronics plate is configured to receive a plurality of electronic components.

8. The system of claim 1 further comprising:
   a second set of one or more fans connected to a second portion of said frame and configured to force circulating gas through a closed loop airflow pathway when activated.

9. The system of claim 1 wherein:
   each of said mounting components comprise display hinge plates and pins;

each of the complementary mounting components comprises hinge plates; and said pins are configured to pass through an aperture in said display hinge plates and reside within a slot in said hinge plates to mate the mounting components with the complementary mounting components when aligned.

10. The system of claim 1 wherein:
the frame is configured for installation at a sidewalk.

11. The system of claim 1 wherein:
the frame is configured for installation at a roof of a vehicle.

12. The system of claim 1 wherein:
the frame is configured for installation at a vehicle.

13. The system of claim 1 further comprising:
at least one fan mounted to said frame.

14. The system of claim 1 wherein:
the frame is configured for installation at a ground surface;
the intakes are located at an upward facing surface between the first selected side assembly and the second selected side assembly; and
the exhausts are located at downward facing surface between the first selected side assembly and the second selected side assembly.

15. The system of claim 14 wherein:
each of said cover side assemblies comprise at least one internal intake which is fluidly internal to the intakes and the exhausts and forms part of said open loop airflow pathway when part of the assembled display unit.

16. An interchangeable display assembly system, said system comprising:
digital side assemblies, each comprising an electronic display;
static side assemblies, each comprising a poster cavity configured to accept signage;
a frame configured to interchangeably accept, on opposing sides thereof, in a universal fashion, and by way of mounting components located at the frame as well as complementary mounting components located at each of the digital side assemblies and the static side assemblies, any one of the digital side assemblies and the static side assemblies (a "first accepted side assembly") at a first side thereof and any other one of the digital side assemblies or the static side assemblies (a "second accepted side assembly") at a second side thereof to define a standalone display assembly unit, the frame defining an interior portion between said first accepted side assembly and said second accepted side assembly;
intakes and exhausts located at the frame in direct fluid connection with an ambient environment, wherein each of said digital side assemblies and static side assemblies comprise internal intakes in indirect fluid connection with the ambient environment, and wherein said internal intakes of said standalone display unit being located laterally internal to said intakes of said frame;
an open loop airflow pathway extending from the intakes of the frame, between the first accepted side assembly and the second accepted side assembly of the standalone display unit, through the internal intakes of any of the digital side assemblies forming part of the standalone display assembly unit, and to the exhaust; and
a set of fans located along the open loop airflow pathway and connected to said frame between the first accepted side assembly and the second accepted side assembly of the standalone display assembly unit;
wherein at least one of said first accepted side assembly or said second accepted side assembly comprises one of the digital side assemblies;
wherein each of said first accepted side assembly and said second accepted side assembly are accepted at said frame in a manner which permits movement between a closed position where said interior portion is enclosed and an open position where said interior portion is accessible.

17. The system of claim 16 wherein:
the frame is configured for installation at a ground surface;
the intakes are located at an upper portion of the frame; and
the exhausts located at a lower portion of the frame at least partially between the first accepted side assembly and the second accepted side assembly.

18. The system of claim 17 wherein:
at least a portion of said open loop airflow pathway extends in a vertical direction through the standalone display unit between the first accepted side assembly and the second accepted side assembly and laterally into any of the digital side assemblies forming part of the standalone display assembly unit by way of the internal intakes.

* * * * *

UNITED STATES PATENT AND TRADEMARK OFFICE
CERTIFICATE OF CORRECTION

| | | |
|---|---|---|
| PATENT NO. | : 11,934,054 B2 | |
| APPLICATION NO. | : 17/171427 | |
| DATED | : March 19, 2024 | |
| INVENTOR(S) | : Dunn et al. | |

It is certified that error appears in the above-identified patent and that said Letters Patent is hereby corrected as shown below:

On the Title Page

In Item (56), References Cited, U.S. Patent Documents, please delete "7,212,403 B2 5/2007 Rockenfell" and insert -- 7,212,403 B2 5/2007 Rockenfeller --.

In Item (56), References Cited, U.S. Patent Documents, please delete "2006/0018093 A1 1/2006 Ai et al." and insert -- 2006/0018093 A1 1/2006 Lai et al. --.

In Item (56), References Cited, U.S. Patent Documents, please delete "2006/0177587 A1 8/2006 Shizuka et al." and insert -- 2006/0177587 A1 8/2006 Ishizuka et al. --.

In Item (56), References Cited, U.S. Patent Documents, please delete "2010/0226091 A1 9/2010 Punn" and insert -- 2010/0226091 A1 9/2010 Dunn --.

Signed and Sealed this
Thirtieth Day of April, 2024

Katherine Kelly Vidal
*Director of the United States Patent and Trademark Office*